United States Patent
Hong

(10) Patent No.: US 12,283,927 B2
(45) Date of Patent: Apr. 22, 2025

(54) SIGNAL LINE SENSE AMPLIFYING CIRCUIT AND INTEGRATED CIRCUIT CAPABLE OF CALIBRATING DRIVING STRENGTH OF MOS TRANSISTORS

(71) Applicant: SK hynix Inc., Icheon-si (KR)

(72) Inventor: Gi Moon Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 436 days.

(21) Appl. No.: 17/964,442

(22) Filed: Oct. 12, 2022

(65) Prior Publication Data
US 2024/0014790 A1  Jan. 11, 2024

(30) Foreign Application Priority Data

Jul. 11, 2022  (KR) .................. 10-2022-0085245

(51) Int. Cl.
*H03K 17/68* (2006.01)
*H03F 3/45* (2006.01)
*H03K 17/687* (2006.01)

(52) U.S. Cl.
CPC ..... *H03F 3/45269* (2013.01); *H03K 17/6872* (2013.01); *H03F 2200/471* (2013.01)

(58) Field of Classification Search
CPC .............. H03K 17/6872; H03F 3/45269
See application file for complete search history.

(56) References Cited

U.S. PATENT DOCUMENTS

| | | | | |
|---|---|---|---|---|
| 6,141,169 | A * | 10/2000 | Pietruszynski | H03F 3/45748 |
| 7,920,397 | B1 * | 4/2011 | Nataraj | G11C 7/12 |
| | | | | 365/49.1 |
| 9,286,955 | B1 * | 3/2016 | Stephens, Jr. | G11C 29/026 |
| 2006/0170453 | A1 * | 8/2006 | Zerbe | H04L 7/0331 |
| | | | | 326/37 |
| 2010/0327914 | A1 | 12/2010 | Mohtashemi | |
| 2012/0153910 | A1 * | 6/2012 | Bulzacchelli | G05F 1/575 |
| | | | | 323/272 |
| 2016/0226452 | A1 * | 8/2016 | Boehm | H03F 3/45475 |
| 2019/0173440 | A1 * | 6/2019 | Rasmus | H03F 3/45771 |
| 2022/0101892 | A1 * | 3/2022 | Dreesen | G11C 7/08 |
| 2023/0186956 | A1 * | 6/2023 | Wieduwilt | G11C 7/08 |
| | | | | 365/203 |

FOREIGN PATENT DOCUMENTS

KR  1020200115805 A  10/2020

* cited by examiner

*Primary Examiner* — Patricia T Nguyen
(74) *Attorney, Agent, or Firm* — WILLIAM PARK & ASSOCIATES LTD.

(57) ABSTRACT

An integrated circuit includes an operation control circuit configured to control generation of a sharing signal, a pre-charge signal, a sensing signal, a latch signal, and a calibration enable signal for a calibration operation and a sense amplifying operation. The integrated circuit also includes a signal line sense amplifying circuit configured to receive the sharing signal, the pre-charge signal, the sensing signal, the latch signal, and the calibration enable signal to perform the calibration operation and the sense amplifying operation.

22 Claims, 16 Drawing Sheets

SIGNAL LINE SENSE AMPLIFYING CIRCUIT AND INTEGRATED CIRCUIT CAPABLE OF CALIBRATING DRIVING STRENGTH OF MOS TRANSISTORS

CROSS-REFERENCE TO RELATED APPLICATION

The present application claims priority under 35 U.S.C. 119(a) to Korean Patent Application No. 10-2022-0085245, filed on Jul. 11, 2022, which is incorporated herein by reference in its entirety.

BACKGROUND

1. Technical Field

Embodiments of the present disclosure relate to a signal line sense amplifying circuit and an integrated circuit that are capable of calibrating the driving strength of MOS transistors.

2. Related Art

In general, an integrated circuit may receive or output various signals through a plurality of signal lines included therein. When transmitting signals through the signal lines, the integrated circuit uses a signal line sense amplifying circuit to sense and amplify the signals of the signal lines and transmit the signals to other signal lines. The signal line sense amplifying circuit includes a plurality of MOS transistors to sense and amplify the signals of the signal lines. Each of the MOS transistors has various process characteristics, and each of the MOS transistors is set to have a driving strength that is determined according to the process characteristics.

SUMMARY

The present disclosure may provide an integrated circuit including an operation control circuit configured to control generation of a sharing signal, a pre-charge signal, a sensing signal, a latch signal, and a calibration enable signal for a calibration operation and a sense amplifying operation, and a signal line sense amplifying circuit configured to receive the sharing signal, the pre-charge signal, the sensing signal, the latch signal, and the calibration enable signal to perform the calibration operation and the sense amplifying operation.

In the present disclosure, the signal line sense amplifying circuit may include MOS transistors for driving input nodes to which input data and inverted input data are input, is configured to calibrate a driving strength of each of the MOS transistors in the calibration operation, and is configured to generate output data by sensing and amplifying the input data and the inverted input data in the sense amplifying operation performed in a state in which the calibration operation is performed.

In addition, the present disclosure may provide a signal line sense amplifying circuit including a sense amplifying circuit including MOS transistors for driving input nodes to which input data and inverted input data are input in a calibration operation and a sense amplifying operation, and a calibration circuit configured to generate calibration signals for calibrating a driving strength of each of the MOS transistors in the calibration operation.

In the present disclosure, the sense amplifying circuit may be configured to sense and amplify the input data and the inverted input data to generate output data and inverted output data in the sense amplifying operation performed in a state in which the calibration operation is performed based on the calibration signals.

In addition, the present disclosure may provide signal line sense amplifying circuit including a sense amplifying circuit including MOS transistors for driving input nodes to which input data and inverted input data are input in a calibration operation and a sense amplifying operation, a first calibration circuit configured to generate first calibration signals for calibrating a driving strength of each of the MOS transistors in the calibration operation, and a second calibration circuit configured to generate second calibration signals for calibrating a driving strength of each of the MOS transistors in the calibration operation.

In the present disclosure, the sense amplifying circuit may be configured to sense and amplify the input data and the inverted input data to generate output data and inverted output data in the sense amplifying operation performed in a state in which the calibration operation is performed based on the first calibration signals and the second calibration signals.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "logic low level, logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
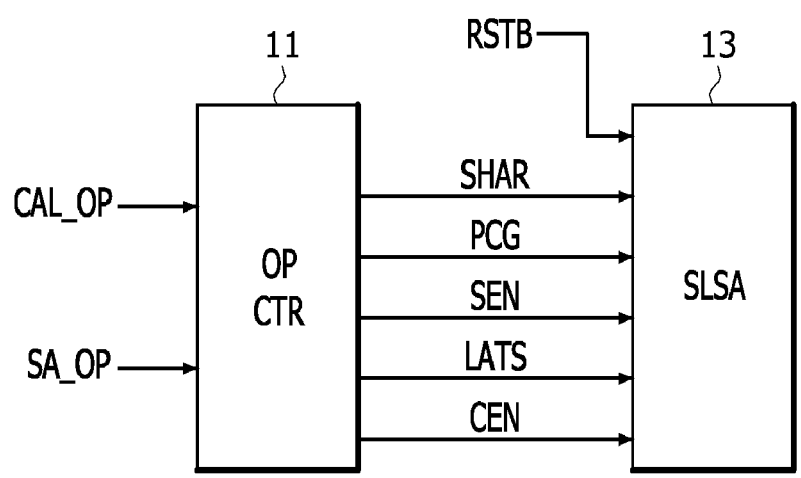
FIG. 1 is a block diagram illustrating a configuration of an integrated circuit according to an embodiment of the present disclosure.

FIG. 1 is a block diagram illustrating a configuration of an integrated circuit 1 according to an embodiment of the present disclosure. As illustrated in FIG. 1, the integrated circuit 1 may include an operation control circuit (OP CTR) 11 and a signal line sense amplifying circuit (SLSA) 13.

The operation control circuit 11 may include one or more processors and/or logic gates. The operation control circuit 11 may control the generation of a sharing signal SHAR, a pre-charge signal PCG, a sensing signal SEN, a latch signal LATS, and a calibration enable signal CEN, based on a calibration operation signal CAL_OP and a sense amplifying operation signal SA_OP. The sharing signal SHAR may be generated to enable a first signal line (SL1 of FIG. 2) and a first inverted signal line (SL1B of FIG. 2) to share signals with input nodes (n111 and n112 of FIG. 2) each other. As an example, the first signal line (SL1 of FIG. 2) may share the signal with one of the input nodes (n111 and n112 of FIG. 2), and the first inverted signal line (SL1B in FIG. 2) may share the signal with the other of the input nodes (n111 and n112 of FIG. 2). When the first signal line (SL1 in FIG. 2) and the first inverted signal line (SL1B in FIG. 2) and the input nodes (n111 and n112 in FIG. 2) share signals, a voltage level difference may be generated between the input nodes (n111 and n112 of FIG. 2) by the signals of the first signal line (SL1 of FIG. 2) and the first inverted signal line (SL1B of FIG. 2). The pre-charge signal PCG may be generated for a pre-charge operation of setting the voltage levels of the input nodes (n111 and n112 of FIG. 2) to be the same. The sensing signal SEN may be generated to sense and amplify input data (DIN of FIG. 2) and inverted input data (DINB of FIG. 2). The latch signal LATS may be generated to generate output data (DOUT of FIG. 2) and inverted output data (DOUTB of FIG. 2) from the input data (DIN of FIG. 2) and the inverted input data (DINB of FIG. 2), respectively. The output data (DOUT of FIG. 2) and the inverted output data (DOUTB of FIG. 2) may be output through a second signal line (SL2 of FIG. 2) and a second inverted signal line (SL2B of FIG. 2), respectively. The calibration enable signal CEN may be generated to generate a first calibration signal CAL1 and a second calibration signal CAL2 by the output data (DOUT of FIG. 2) and the inverted output data (DOUTB of FIG. 2), respectively, in a calibration operation. The calibration operation signal CAL_OP may be generated to perform the calibration operation for calibrating the driving strength of the metal-oxide semiconductor field-effect (MOS) transistors (113_1 and 113_2 of FIG. 2) included in the signal line sense amplifying circuit 13.

The operation control circuit 11 may sequentially apply the pre-charge signal PCG, the sensing signal SEN, the latch signal LATS, and the calibration enable signal CEN whose generation is controlled based on the calibration operation signal CAL_OP to the signal line sense amplifying circuit 13 in the calibration operation. The sense amplifying operation signal SA_OP may be generated to perform a sense amplifying operation of sensing and amplifying the input data (DIN of FIG. 2) and the inverted input data (DINB of FIG. 2) that are input through the first signal line (SL1 of FIG. 2) and the first inverted signal line (SL1B of FIG. 2), respectively, in a state in which the calibration operation is performed and the driving strength of the MOS transistors (113_1 and 113_2 in FIG. 2) is calibrated. The operation control circuit 11 may sequentially apply the pre-charge signal PCG, the sharing signal SHAR, the sensing signal SEN, and the latch signal LATS whose generation is controlled based on the sense amplifying operation signal SA_OP to the signal line sense amplifying circuit 13 in the sense amplifying operation.

The signal line sense amplifying circuit 13 may be connected to the operation control circuit 11 and may receive the sharing signal SHAR, the pre-charge signal PCG, the sensing signal SEN, the latch signal LATS, and the calibration enable signal CEN from the operation control circuit 11. The signal line sense amplifying circuit 13 may receive a reset signal RSTB, the pre-charge signal PCG, the sensing signal SEN, the latch signal LATS, and the calibration enable signal CEN to perform the calibration operation. The signal line sense amplifying circuit 13 may be initialized by the reset signal RSTB in the calibration operation. The signal line sense amplifying circuit 13 may perform the pre-charge operation of setting the logic levels of the input data (DIN of FIG. 2) and the inverted input data (DINB of FIG. 2) to be the same by the pre-charge signal PCG in the calibration operation. The signal line sense amplifying circuit 13 may sense and amplify the input data (DIN of FIG. 2) and the inverted input data (DINB of FIG. 2) by the sensing signal SEN in the calibration operation. The signal line sense amplifying circuit 13 may generate the output data (DOUT of FIG. 2) and the inverted output data (DOUTB of FIG. 2) from the input data (DIN of FIG. 2) and the inverted input data (DINB of FIG. 2) by the latch signal LATS, respectively, and may output the output data (DOUT of FIG. 2) and the inverted output data (DOUTB of FIG. 2) through the second signal line (SL2 of FIG. 2) and the second inverted signal line (SL2B of FIG. 2), respectively, in the calibration operation. The signal line sense amplifying circuit 13 may generate the first calibration signal CAL1 and the second calibration signal CAL2 from the output data (DOUT of FIG. 2) and the inverted output data (DOUTB of FIG. 2), respectively, by the calibration enable signal CEN in the calibration operation. The signal line sense amplifying circuit 13 may calibrate the driving strength of the MOS transistors (113_1 and 113_2 of FIG. 2) by the first calibration signal CAL1 and the second calibration signal CAL2. The signal line sense amplifying circuit 13 may receive the pre-charge signal PCG, the sharing signal SHAR, and the latch signal LATS to perform the sense amplifying operation after the calibration operation. The signal line sense amplifying circuit 13 may stop the pre-charge operation by the pre-charge signal PCG in the sense amplifying operation performed after the calibration operation. The signal line sense amplifying circuit 13 may enable the first signal line (SL1 of FIG. 2) and the first inverted signal line (SL1B of FIG. 2) to share the signals with the input nodes (n111 and n112 of FIG. 2) by the sharing signal SHAR in the sense amplifying operation performed after the calibration operation. The signal line sense amplifying circuit 13 may generate the output data (DOUT of FIG. 2) and the inverted output data (DOUTB of FIG. 2) from the input data (DIN of FIG. 2) and the inverted input data (DINB of FIG. 2), respectively, by the latch signal LATS in the sense amplifying operation performed after the calibration operation, and may output the output data (DOUT of FIG. 2) and the inverted output data (DOUTB of FIG. 2) through the second signal line (SL2 of FIG. 2) and the second inverted signal line (SL2B of FIG. 2), respectively.

Figure 2:
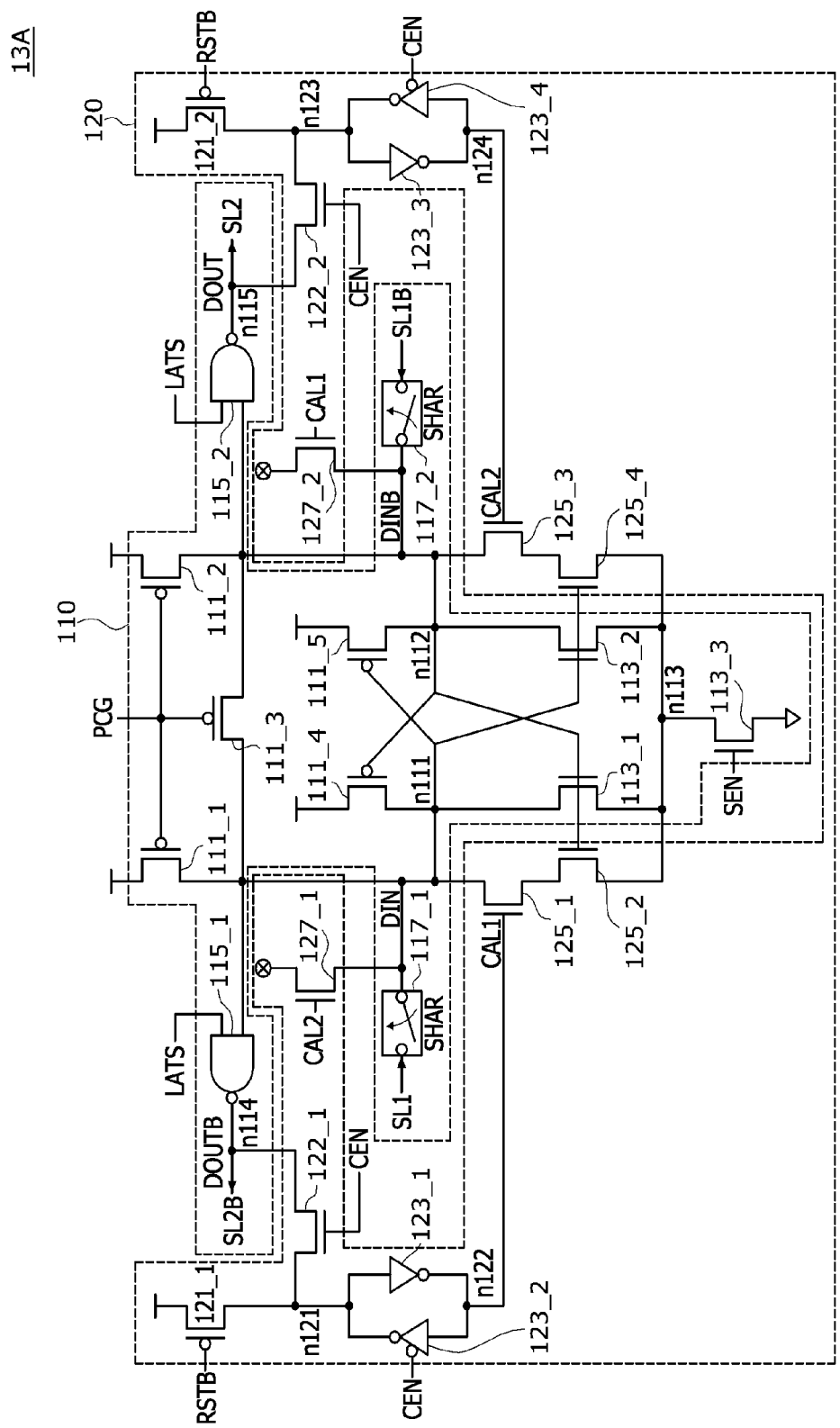
FIG. 2 is a circuit diagram of a signal line sense amplifying circuit according to an embodiment of the present disclosure.

FIG. 2 is a circuit diagram of a signal line sense amplifying circuit 13A according to an embodiment of the present disclosure. As shown in FIG. 2, the signal line sense amplifying circuit 13A may include a sense amplifying circuit 110 and a calibration circuit 120.

The sense amplifying circuit 110 may include PMOS transistors 111_1, 111_2, 111_3, 111_4, and 111_5; NMOS transistors 113_1, 113_2, and 113_3; NAND gates 115_1 and 115_2; and switching devices 117_1 and 117_2. The PMOS transistor 111_1 may be turned on when a pre-charge signal PCG is generated at a logic "low" level for a pre-charge operation to drive input data DIN to a logic "high" level. The PMOS transistor 111_2 may be turned on when the pre-charge signal PCG is generated at a logic "low" level for the pre-charge operation to drive inverted input data DINB to a logic "high" level. The PMOS transistor 111_3 may be turned on when the pre-charge signal PCG is generated at a logic "low" level for the pre-charge operation to set the voltage level of the input data DIN to be the same as the voltage level of the inverted input data DINB. The PMOS transistors 111_1, 111_2, and 111_3 may be turned off by the pre-charge signal PCG generated at a logic "high" level in a calibration operation and a sense amplifying operation. The PMOS transistor 111_4 may be turned on by the inverted input data DINB of a node n112 when a sensing signal SEN is generated at a logic "high" level to drive the input data DIN of the node n111 to a logic "high" level in the calibration operation and the sense amplifying operation. The nodes n111 and n112 may be set as input nodes. The PMOS transistor 111_5 may be turned on by the input data DIN of the node n111 when the sensing signal SEN is generated at a logic "high" level to drive the inverted input data DINB of the node n112 to a logic "high" level in the calibration operation and the sense amplifying operation.

The NMOS transistor 113_1 may be connected between the node n111 and a node n113, and may be turned on by the inverted input data DINB of the node n112 when the sensing signal SEN is generated at a logic "high" level to drive the input data DIN of the node n111 to a logic "low" level in the calibration operation and the sense amplifying operation. The NMOS transistor 113_2 may be connected between the node n112 and the node n113, and may be turned on by the input data DIN of the node n111 when the sensing signal SEN is generated at a logic "high" level to drive the inverted input data DINB of the node n112 to a logic "low" level in the calibration operation and the sense amplifying operation. The NMOS transistor 113_3 may be turned on when the sensing signal SEN is generated at a logic "high" level to drive the node n113 to a logic "low" level in the calibration operation and the sense amplifying operation. The NAND gate 115_1 may receive a latch signal LATS and the input data DIN to perform a logical NAND operation. The NAND gate 115_1 may inversely buffer the input data DIN when the latch signal LATS is generated at a logic "high" level to output the inversely buffered signal of the input data DIN as the inverted output data DOUTB of a node n114 in the calibration operation and the sense amplifying operation. The inverted output data DOUTB may be output through a second inverted signal line SL2B. The NAND gate 115_2 may receive the latch signal LATS and the inverted input data DINB to perform a logical NAND operation. The NAND gate 115_2 may inversely buffer the inverted input data DINB when the latch signal LATS is generated at a logic "high" level to output the inversely buffered signal of the inverted input data DINB as the output data DOUT of a node n115 in the calibration operation and the sense amplifying operation. The output data DOUT may be output through a second signal line SL2.

The switching device 117_1 may be turned on when the sharing signal SHAR is generated at a logic "high" level and may connect the first signal line SL1 and the node n111 so that the first signal line SL1 and the node n111 share the input data DIN with each other in the sense amplifying operation. The switching device 117_2 may be turned on when the sharing signal SHAR is generated at a logic "high" level and may connect the first inverted signal line SL1B and the node n112 so that the first inverted signal line SL1B and the node n112 share the inverted input data DINB with each other in the sense amplifying operation. A voltage difference may occur between the input data DIN shared by the first signal line SL1 and the inverted input data DINB shared by the first inverted signal line SL1B.

The calibration circuit 120 may include PMOS transistors 121_1 and 121_2; NMOS transistors 122_1, 122_2, 125_1, 125_2, 125_3, 125_4, 127_1, and 127_2; and inverters 123_1, 123_2, 123_3, and 123_4. The PMOS transistor 121_1 may be turned on when a reset signal RSTB is generated at a logic "low" level for initialization to initialize a node n121 to a logic "high" level. The PMOS transistor 121_2 may be turned on when the reset signal RSTB is generated at a logic "low" level for initialization to initialize a node n123 to a logic "high" level. The NMOS transistor 122_1 may be connected between the node n114 and the node n121, and may be turned on when a calibration enable signal CEN is generated at a logic "high" level for the calibration operation to set the logic level of the node n121 according to the inverted output signal DOUTB of the node n114. The NMOS transistor 122_2 may be connected between the node n115 and the n123, and may be turned on when the calibration enable signal CEN is generated at a logic "high" level for the calibration operation to set the logic level of the node n123 according to the output signal DOUT of the node n115. The inverter 123_1 may inversely buffer the signal of the node n121 to output the inversely buffered signal of the node n121 as the first calibration signal CAL1 The inverter 123_2 may inversely buffer the first calibration signal CAL1 of the node n122 to output the inversely buffered signal of the first calibration signal CAL1 to the node n121 when the calibration operation is not performed and the calibration enable signal CEN is generated at a logic "low" level. The inverter 123_3 may inversely buffer the signal of the node n123 to output the inversely buffered signal of the node n123 as the second calibration signal CAL2 of the node n124. The inverter 123_4 may inversely buffer the second calibration signal CAL2 of the node n124 to output the inversely buffered signal of the second calibration signal CAL2 to the node n123 when the calibration operation is not performed and the calibration enable signal CEN is generated at a logic "low" level. The logic levels of the first calibration signal CAL1 and the second calibration signal CAL2 may be determined by the driving strength of the NMOS transistor 113_1 and the driving strength of the NMOS transistor 113_2, respectively. For example, when the driving strength of the NMOS transistor 113_1 is set to be weaker than the driving strength of the NMOS transistor 113_2, the first calibration signal CAL1 may be generated at a logic "high" level, and the second calibration signal CAL2 may be generated at a logic "low" level. In another example, when the driving strength of the NMOS transistor 113_2 is set to be weaker than the driving strength of the NMOS transistor 113_1, the first calibration signal CAL1 may be generated at a logic "low" level, and the second calibration signal CAL2 may be generated at a logic "high" level. In further another example, when the driving strength of the NMOS transistor 113_2 and the driving strength of the NMOS transistor 113_1 are set to be the same, both the first calibration signal CAL1 and the second calibration signal CAL2 may be generated at logic "high" levels. The NMOS transistors 125_1 and 125_2 may be connected in series between the node n111 and the node n113. The NMOS transistor 125_1 may be turned on when the driving strength of the NMOS transistor 113_1 is set to be weaker than that of the NMOS transistor 113_2 and the first calibration signal CAL1 is generated at a logic "high" level, and may operate as a calibration device that calibrates the driving strength of the NMOS transistor 113_1. The NMOS transistor 125_2 may be turned on when the inverted input signal DINB of the node n112 is at a logic "high" level. The NMOS transistors 125_3 and 125_4 may be connected in series to each other between the node n112 and the node n113. The NMOS transistor 125_3 may be turned on when the driving strength of the NMOS transistor 113_2 is set to be weaker than that of the NMOS transistor 113_1 and the second calibration signal CAL2 is generated at a logic "high" level, and may operate as a calibration device that calibrates the driving strength of the NMOS transistor 113_2. The NMOS transistor 125_4 may be turned on when the input signal DIN of the node n111 is at a logic "high" level. The NMOS transistor 127_1 may be connected between the node n111 and a floating node, and may be turned on by the second calibration signal CAL2. The NMOS transistor 127_2 may be connected between the node n112 and the floating node, and may be turned on by the first calibration signal CAL1. Each of the NMOS transistor 127_1 and the NMOS transistor 127_2 may operate as a compensating device that compensates for a capacitance difference between the input nodes n111 and n112 after the calibration operation is performed. For example, when the first calibration signal CAL1 is generated at a logic "high" level and the second calibration signal CAL2 is generated at a logic "low" level by the calibration operation, the NMOS transistor 125_1 connected to the node n111 and the NMOS transistor 127_2 connected to the node n112 may be symmetrically turned on, and the NMOS transistor 125_3 connected to the node n112 and the NMOS transistor 127_1 connected to the node n111 may be symmetrically turned off. Accordingly, the capacitance difference between the input nodes n111 and n112 may be reduced or minimized. In another example, when the first calibration signal CAL1 is generated at a logic "low" level and the second calibration signal CAL2 is generated at a logic "high" level by the calibration operation, the NMOS transistor 125_3 connected to the node n112 and the NMOS transistor 127_1 connected to the node n111 may be symmetrically turned on, and the NMOS transistor 125_1 connected to the node n111 and the NMOS transistor 127_2 connected to the node n112 may be symmetrically turned off. Accordingly, the capacitance difference between the input nodes n111 and n112 may be reduced or minimized. The NMOS transistors 127_1 and 127_2 might not be used according to embodiments.

The signal line sense amplifying circuit 13A may perform the calibration operation of setting the logic levels of the first calibration signal CAL1 and the second calibration signal CAL2 according to the driving strength of the NMOS transistor 113_1 and the NMOS transistor 113_2, respectively, and may perform the sense amplifying operation of sensing and amplifying the signals of the first signal line SL1 and the first inverted signal line SL2 in a state in which the driving strength of the NMOS transistor 113_1 and the driving strength of the NMOS transistor 113_2 are calibrated to output the sense amplified signals through the second signal line SL2 and the second inverted signal line SL2B.

FIGS. 3 to 8 are a timing diagram and circuit diagrams illustrating a calibration operation of a signal line sense amplifying circuit 13A according to an embodiment of the present disclosure. Hereinafter, the calibration operation of the signal line sense amplifying circuit 13A will be described in more detail with reference to FIGS. 3 to 8, and the calibration operation will be described on the assumption that the driving strength of the NMOS transistor 113_1 is weaker than that of the NMOS transistor 113_2. In FIGS. 3 to 8, the same reference numerals as in FIG. 2 may indicate the same components.

Figure 3:
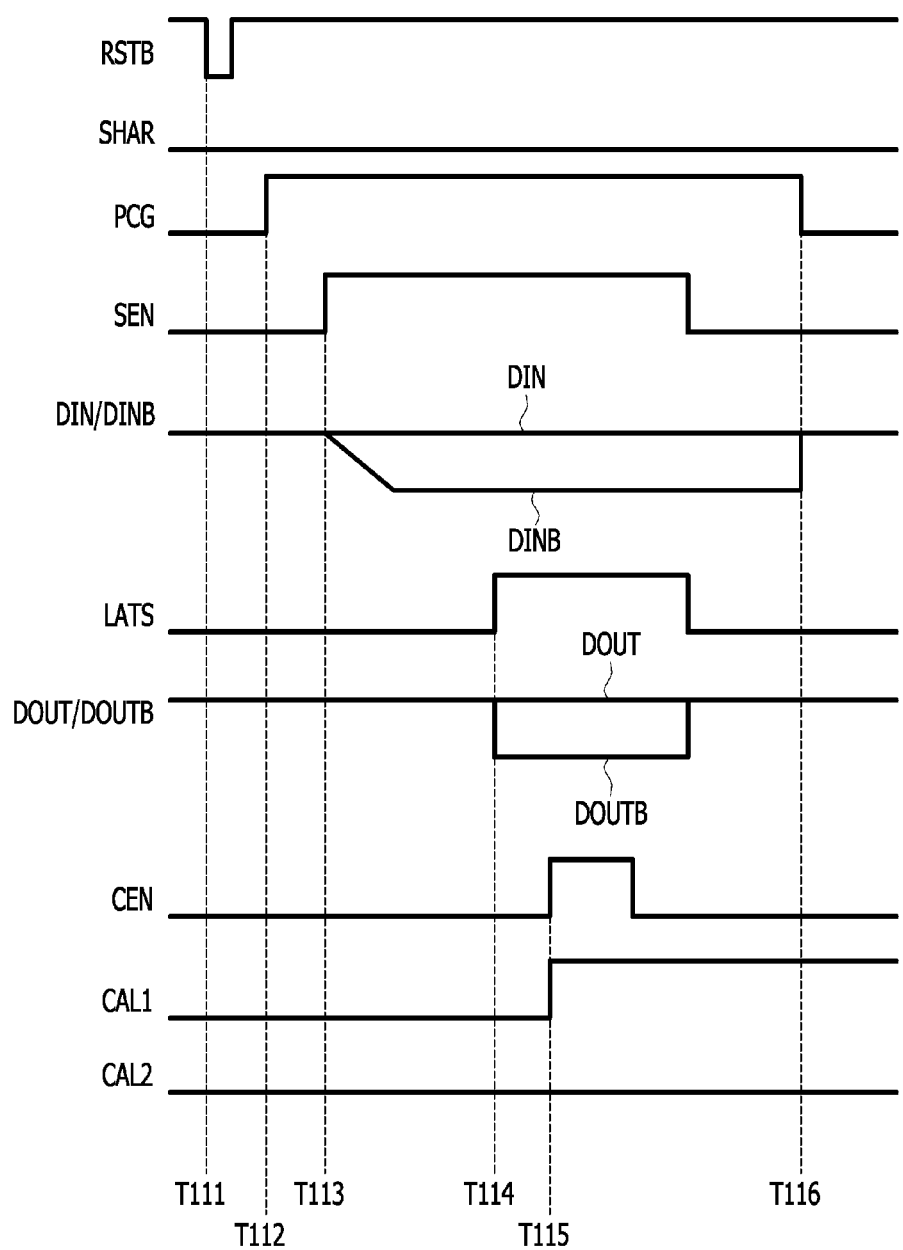
FIGS. 3 to 8 are a timing diagram and circuit diagrams illustrating a calibration operation of a signal line sense amplifying circuit according to an embodiment of the present disclosure.
Figure 4:
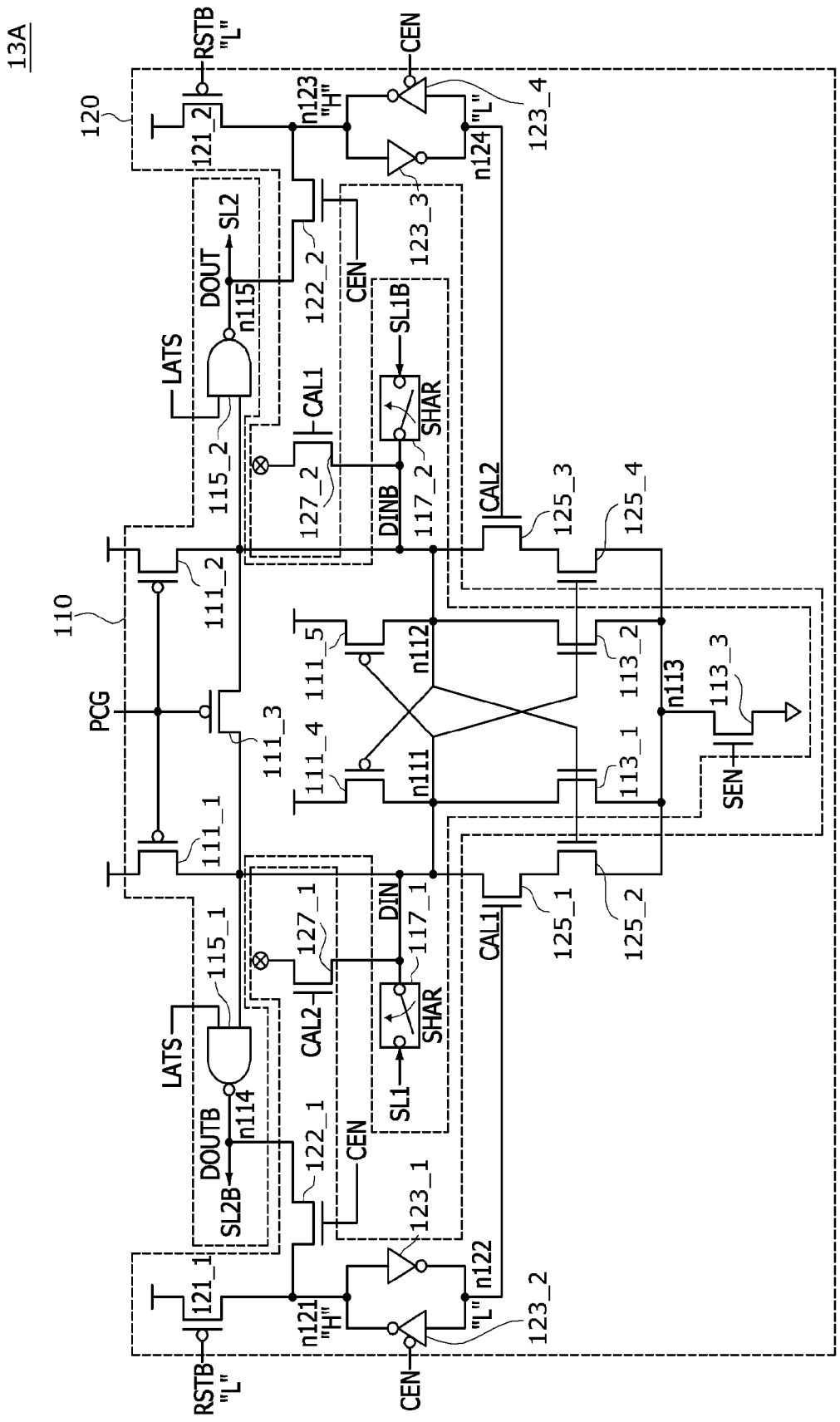

First, as shown in FIGS. 3 and 4, because the NMOS transistors 121_1 and 121_2 are turned on when a reset signal RSTB is generated at a logic "low" level ("L") for initialization at a time point T111, the node n121 and node n123 may all be initialized to a logic "high" level ("H"), and both the first calibration signal CAL1 of the node n122 and the second calibration signal CAL2 of the node n124 may be initialized to a logic "low" level ("L").

Figure 5:
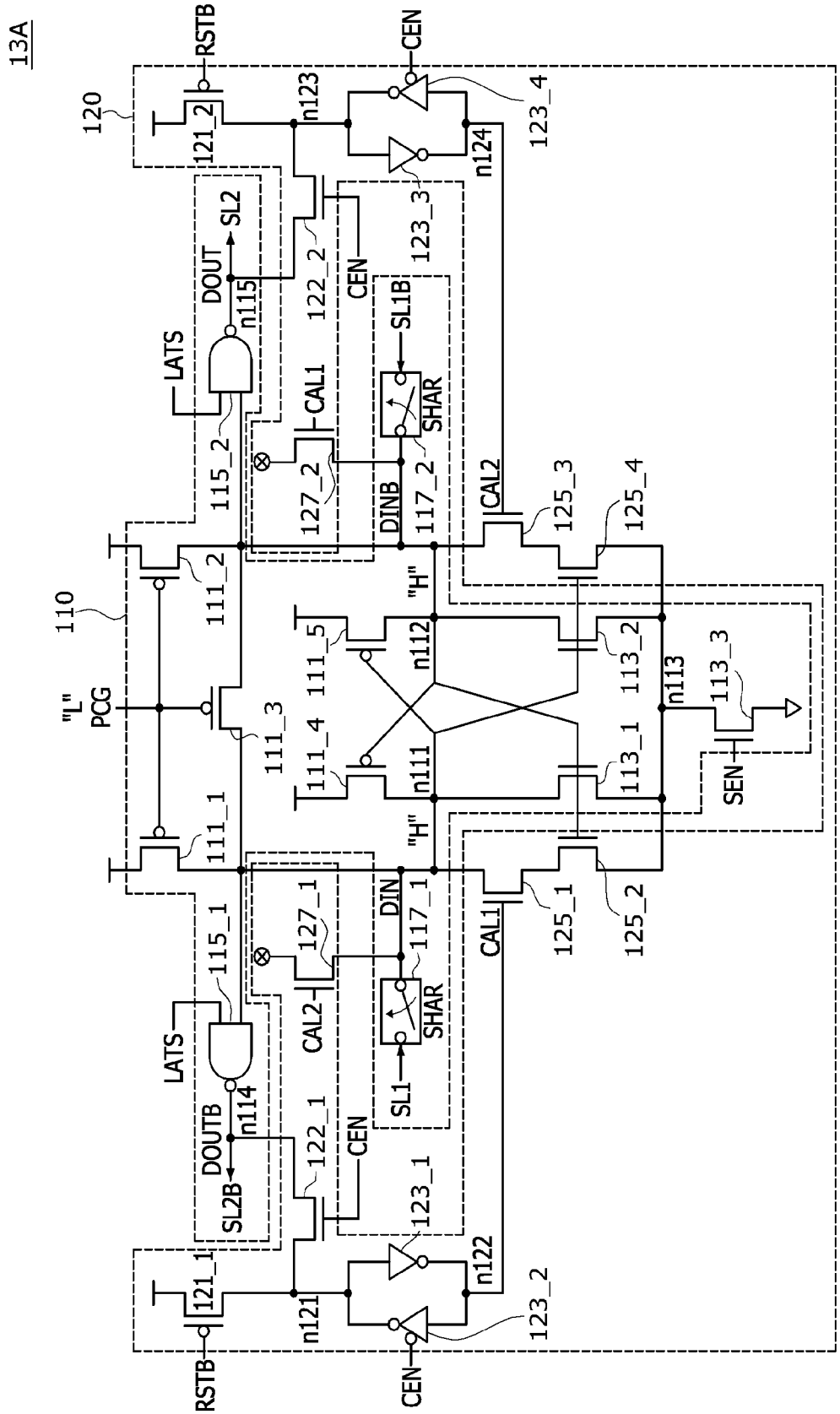

Next, as shown in FIGS. 3 and 5, because a pre-charge signal PCG is generated at a logic low level ("L") for a pre-charge operation during the section before a time point T112, the PMOS transistors 111_1, 111_2, and 111_3 may all be turned on, and the input data DIN of the node n111 and the inverted input data DINB of the node n112 may all be set to a logic "high" level ("H").

Figure 6:
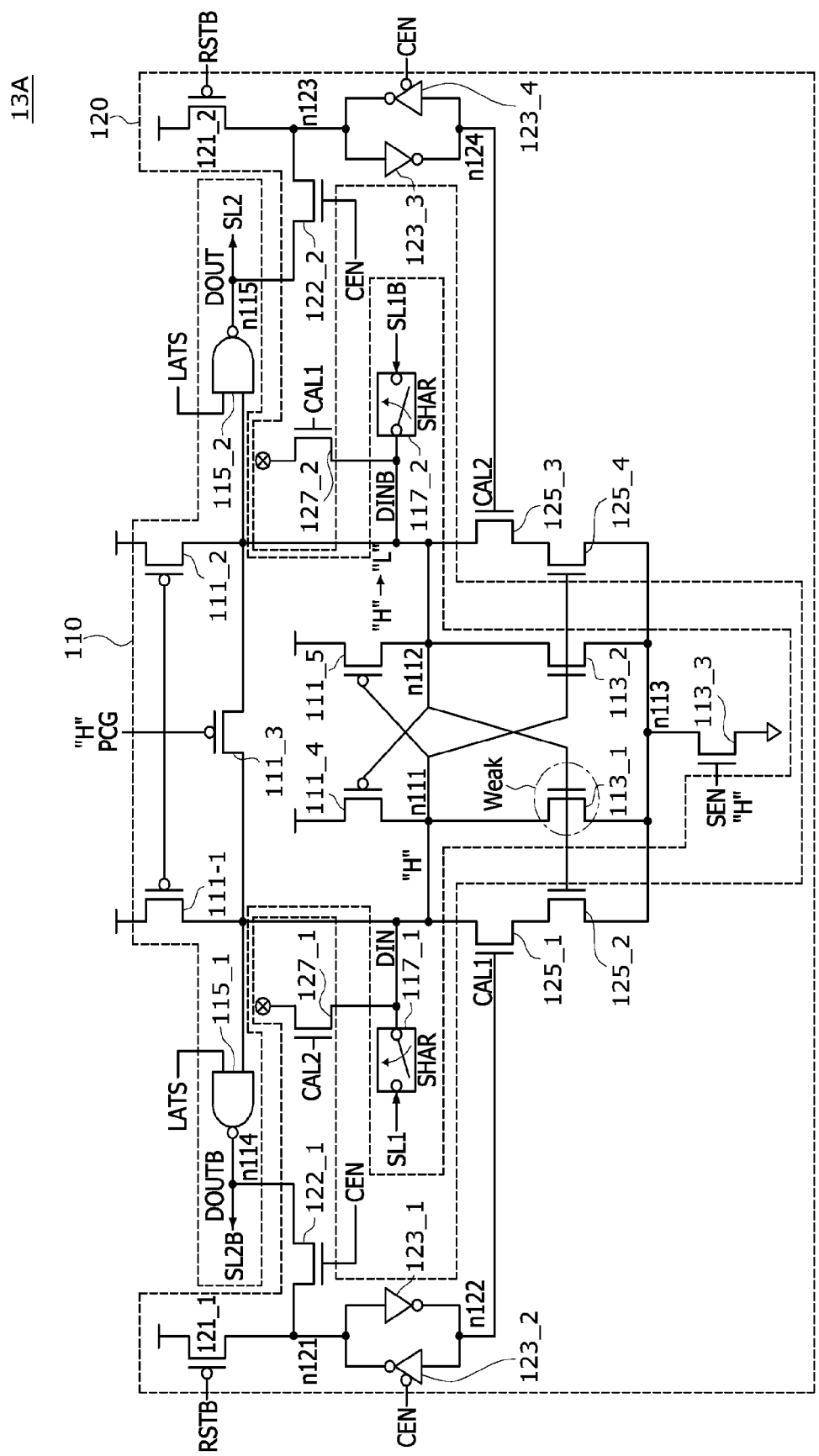

Next, as shown in FIGS. 3 and 6, because the pre-charge signal PCG transitions from a logic "low" level ("L") to a logic "high" level ("H") at the time point T112, the PMOS transistors 111_1, 111_2, and 111_3 may all be turned off.

Next, as shown in FIGS. 3 and 6, because a sensing signal SEN is generated at a logic high level ("H") from a time point T113, the input data DIN of the node n111 and the inverted input data DINB of the node n112 may be sensed and amplified by the PMOS transistors 111_4 and 111_5 and the NMOS transistors 113_1 and 113_2. Because the driving strength of the NMOS transistor 113_1 is weaker than the driving strength of the NMOS transistor 113_2, the input data DIN of the node n111 may maintain the logic "high" level ("H") through the sense amplifying operation by the PMOS transistors 111_4 and 111_5 and the NMOS transistors 113_1 and 113_2, and the inverted input data DINB of the node n112 may transition from the logic "high" level ("H") to a logic "low" level ("L").

Figure 7:
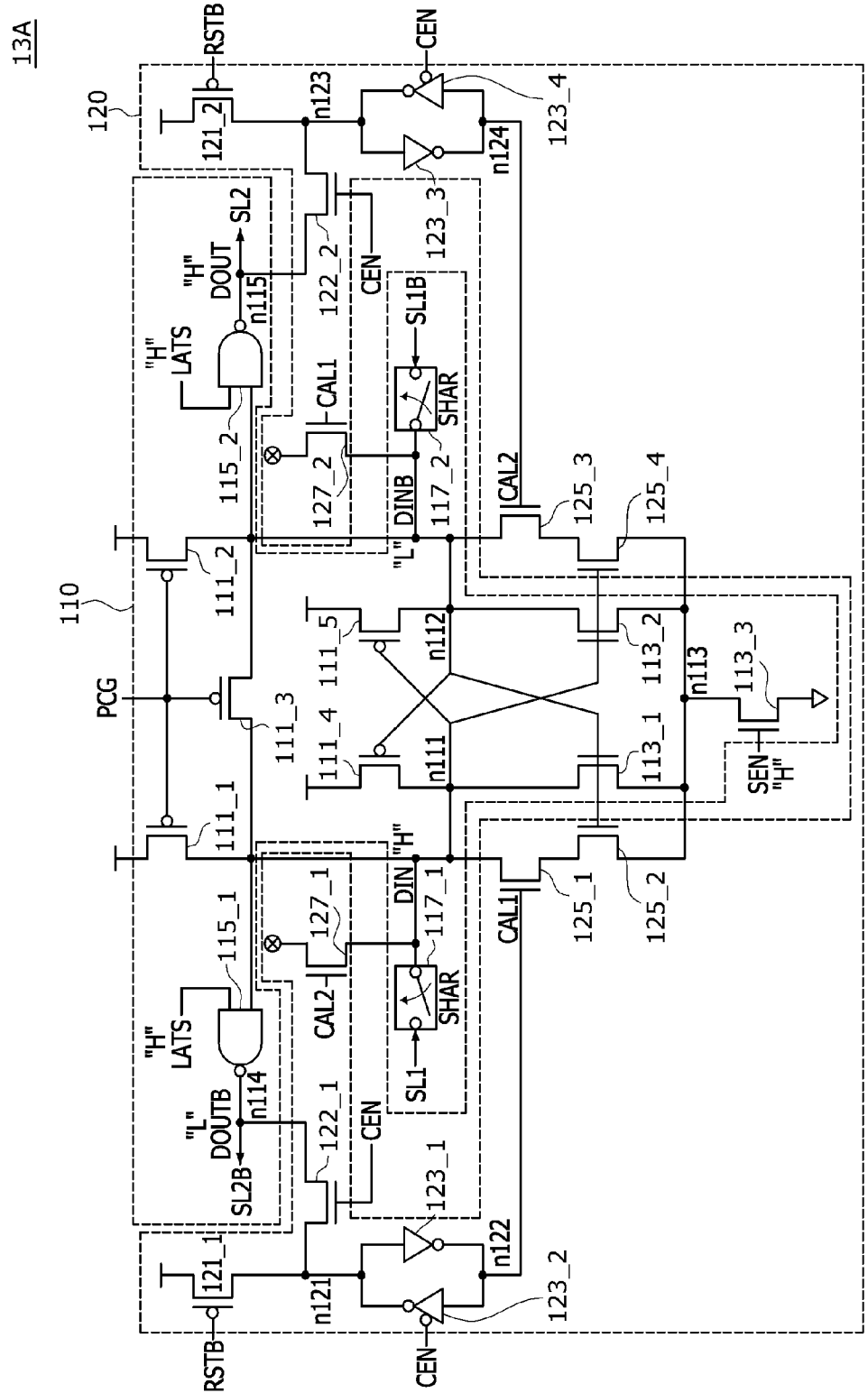

Next, as shown in FIGS. 3 and 7, because a latch signal LATS is generated at a logic "high" level ("H") from a time point T114, inverted output data DOUTB may be generated at a logic "low" level ("L") by the input data DIN of the logic "high" level ("H"), and output data DOUT may be generated at a logic "high" level ("H") by the inverted input data DINB of the logic "low" level ("L").

Figure 8:
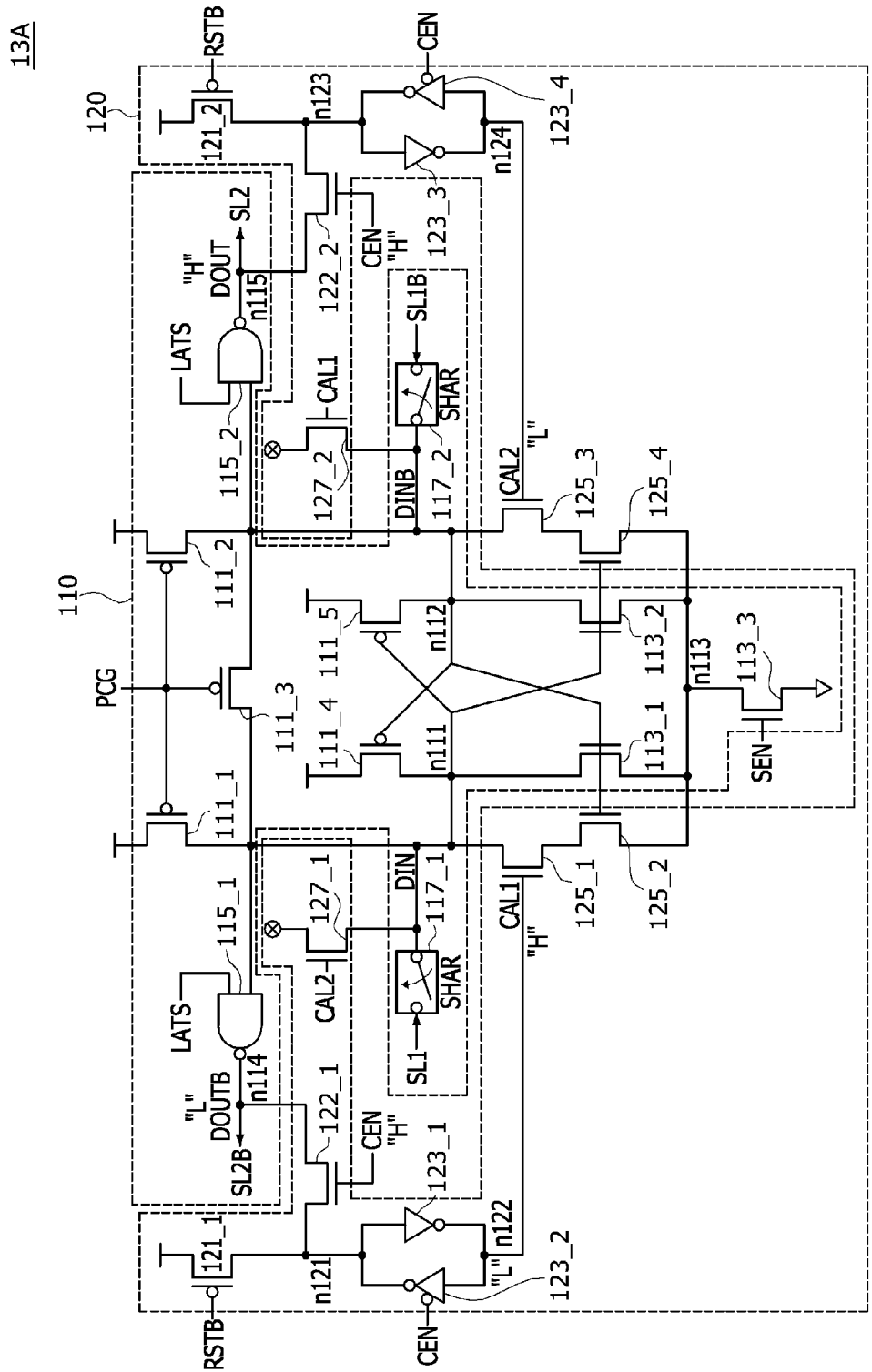

Next, as shown in FIGS. 3 and 8, because a calibration enable signal CEN is generated at a logic "high" level ("H") from a time point T115, a first calibration signal CAL1 may be generated at a logic "high" level ("H") by the inverted output data DOUTB of the logic "low" level ("L"), and a second calibration signal CAL2 may be generated at a logic "low" level ("L") by the output data DOUT of the logic "high" level ("H"). When the NMOS transistor 125_1 is turned on by the first calibration signal CAL1 of the logic "high" level ("H"), the NMOS transistors 125_1 and 125_2 may drive the input data DIN of the node n111 together with the NMOS transistor 113_1. Accordingly, the driving strength of the NMOS transistor 113_1 may be calibrated by the NMOS transistors 125_1 and 125_2.

Finally, as shown in FIG. 3, at a time point T116, because the pre-charge signal PCG transitions from the logic "high" level ("H") to a logic "low" level ("L") and all of the PMOS transistors 111_1, 111_2, and 111_3 may be turned on, a pre-charge operation in which both the input data DIN of the node n111 and the inverted input data DINB of the node n112 are set to logic "high" levels ("H") may be performed.

FIGS. 9 to 12 are diagrams illustrating a sense amplifying operation of a signal line sense amplifying circuit 13A according to an embodiment of the present disclosure. Hereinafter, the sense amplifying operation of the signal line sense amplifying circuit 13A will be described with reference to FIGS. 9 to 12, and the sense amplifying operation will be described on the assumption that the sense amplifying operation is performed on the first signal line SL1 set to a logic "low" level and the first inverted signal line SL1B set to a logic "high" level in a state in which the driving strength of the NMOS transistor 113_1 is weaker than that of the NMOS transistor 113_2. In FIGS. 9 to 12, the same reference numerals as in FIG. 2 may indicate the same components.

Figure 9:
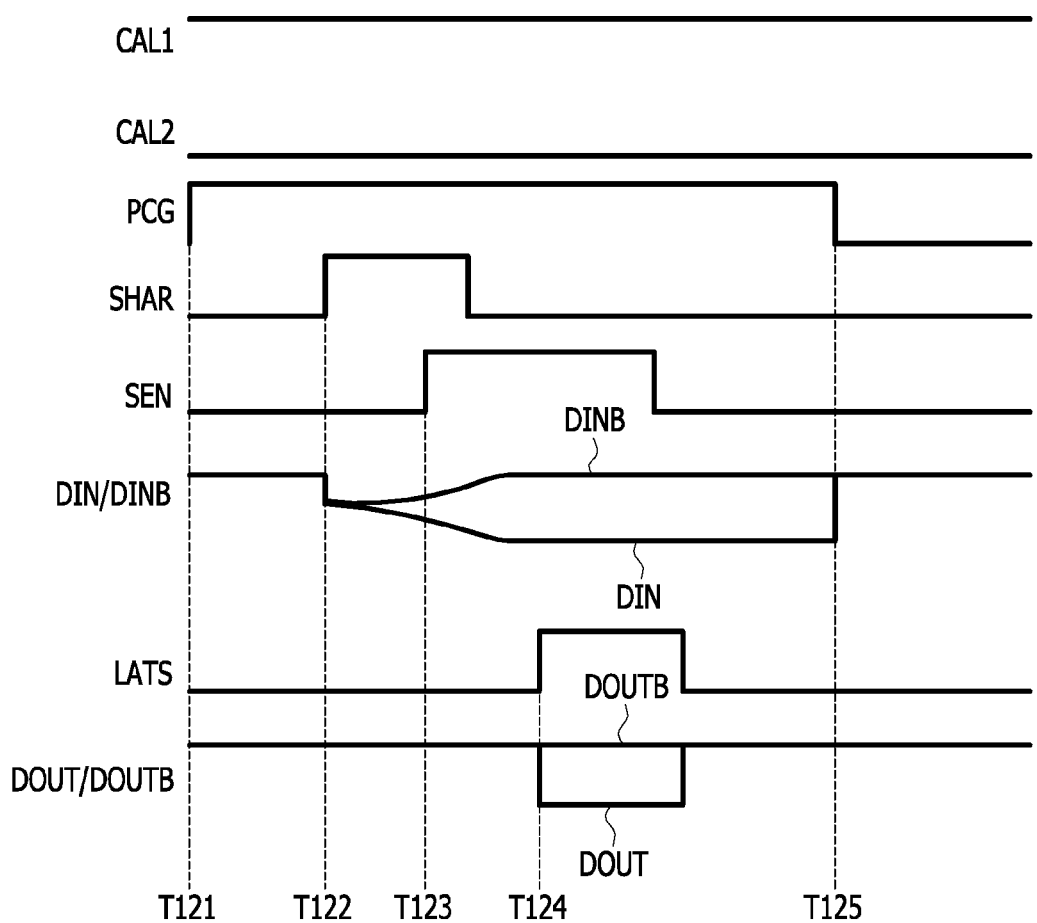
FIGS. 9 to 12 are a timing diagram and circuit diagrams illustrating a sense amplifying operation of a signal line sense amplifying circuit according to an embodiment of the present disclosure.
Figure 10:
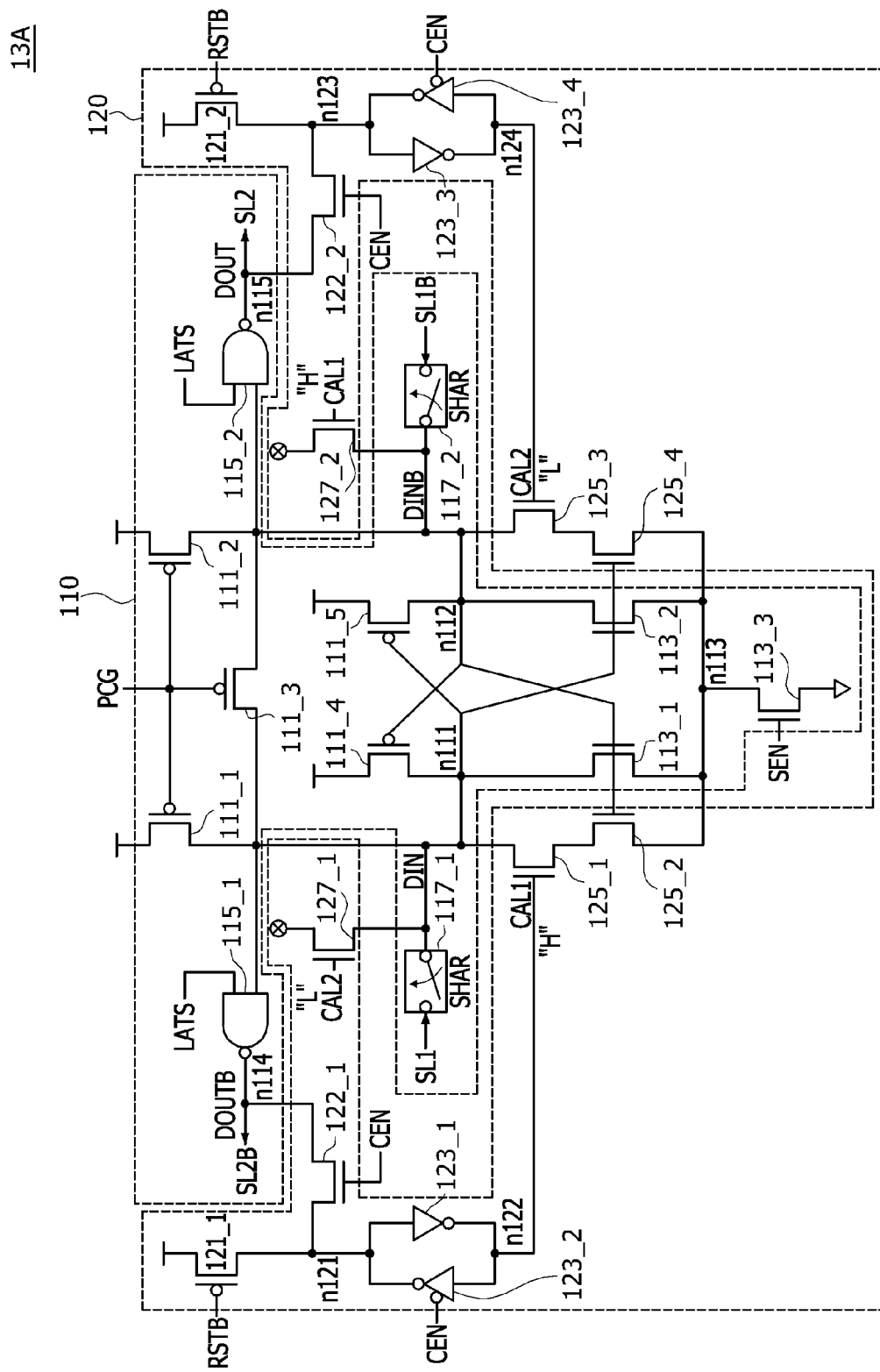

First, as shown in FIGS. 9 and 10, when a first calibration signal CAL1 is generated at a logic "high" level by a calibration operation, the NMOS transistor 125_1 connected to the node n111 may be turned on to calibrate the NMOS transistor 113_1 having a driving strength that is weaker than that of the NMOS transistor 113_2. In addition, when the first calibration signal CAL1 is generated at a logic "high" level and a second calibration signal CAL2 is generated at a logic "low" level by the calibration operation, the NMOS transistor 125_1 connected to the node n111 and the NMOS transistor 127_2 connected to the node n112 may be symmetrically turned on, and the NMOS transistor 125_3 connected to the node n112 and the NMOS transistor 127_1 connected to the node n111 may be symmetrically turned off. Accordingly, a capacitance difference between the input nodes n111 and n112 may be reduced or minimized.

Figure 11:
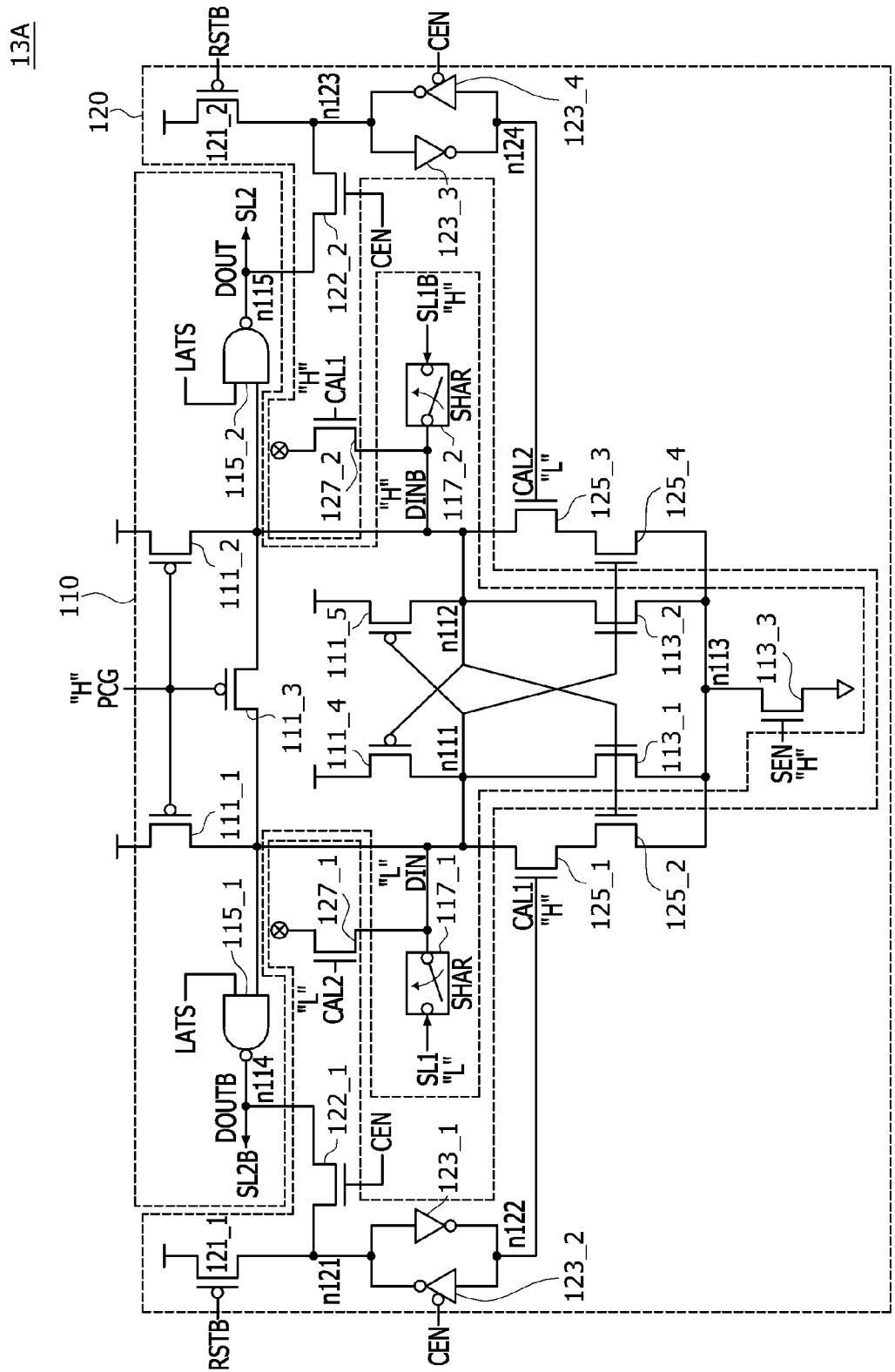

Next, as shown in FIGS. 9 and 11, at a time point T121, because the pre-charge signal PCG transitions from a logic "low" level ("L") to a logic "high" level ("H"), the PMOS transistors 111_1, 111_2, and 111_3 may all be turned off. At a time point T122, a sharing signal SHAR is generated at a logic "high" level ("H") and the first signal line SL1 and the first inverted signal line SL1B share signals with the input nodes n111 and n112, so that the inverted input data DINB of the node n112 may be set to have a higher voltage level than the input data DIN of the node n111. Because the sensing signal SEN is generated at a logic "high" level ("H") from a time point T123, the input data DIN of the node n111 may be generated at a logic "low" level ("L"), and the inverted input data DINB of the node n112 may be generated at a logic "high" level ("H").

Figure 12:
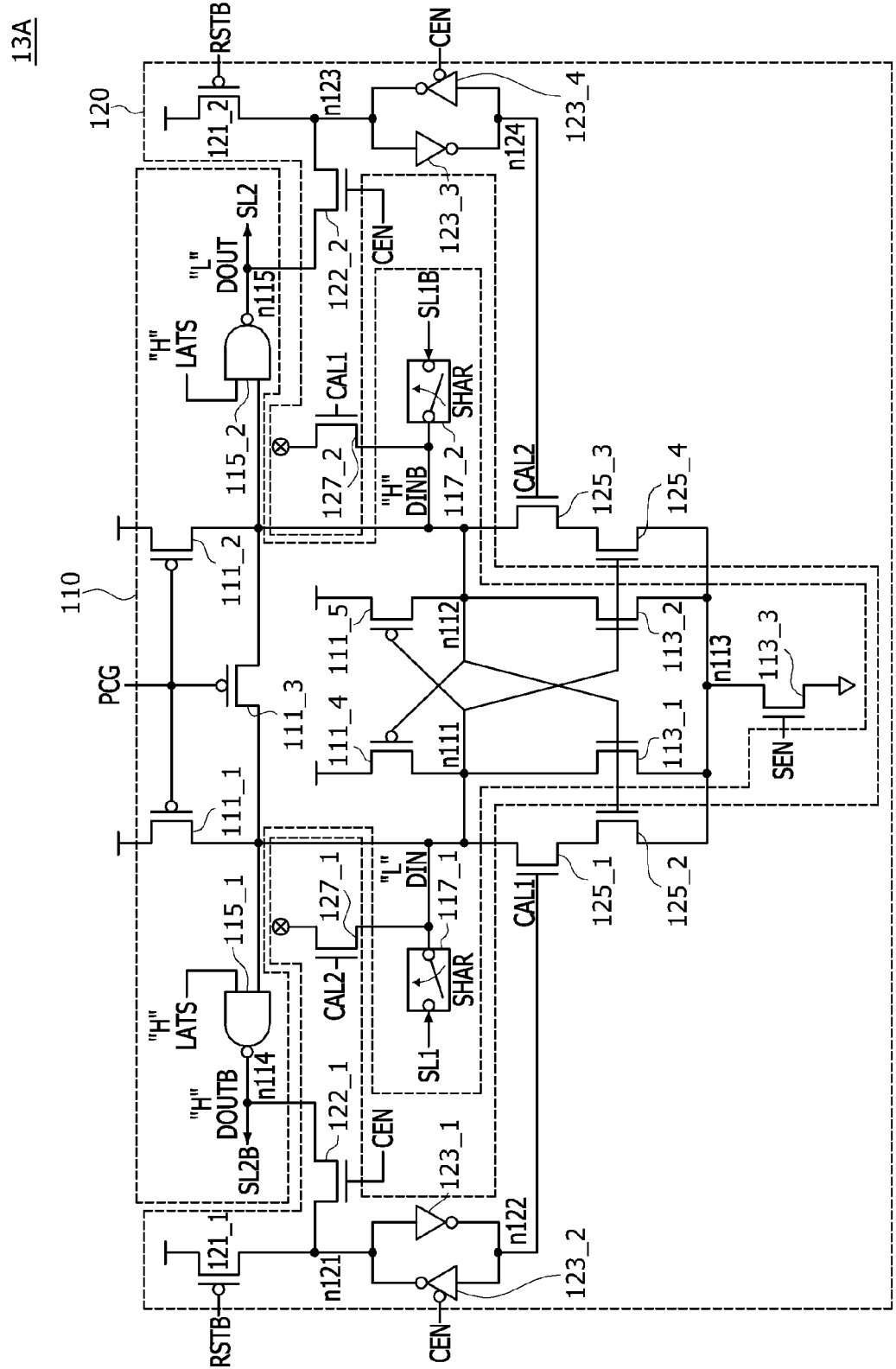

Next, as shown in FIGS. 9 and 12, because the latch signal LATS is generated at a logic "high" level ("H") from a time point T124, the inverted output data DOUTB may be generated at a logic "high" level ("H") by the input data DIN of a logic "low" level ("L"), and the output data DOUT may be generated at a logic "low" level ("L") by the inverted input data DINB of a logic "high" level ("H").

Finally, as shown in FIG. 9, at a time point T125, because the pre-charge signal PCG transitions from a logic "high" level ("H") to a logic "low" level ("L"), a pre-charge operation in which both the input data DIN of the node n111 and the inverted input data DINB of the node n112 are set to a logic "high" level may be performed.

In the present disclosure, it is described as an example that the sensing signal SEN and the latch signal LATS are implemented as separate signals, but according to other embodiments, the sensing signal SEN and the latch signal LATS may be implemented as the same signal. The NAND gates 115_1 and 115_2 included in the sense amplifying circuit 110 may be implemented to operate by receiving the sensing signal SEN instead of the latch signal LATS.

Figure 13:
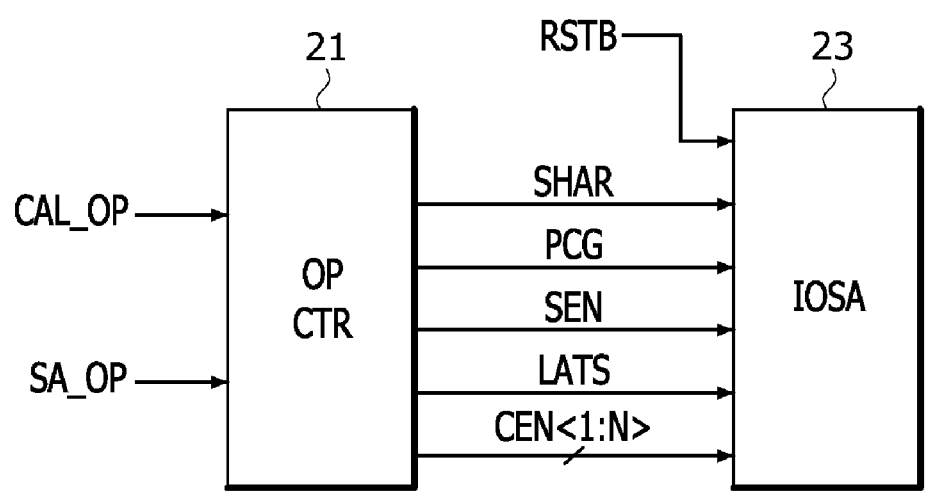
FIG. 13 is a block diagram illustrating a configuration of an integrated circuit according to another embodiment of the present disclosure.

FIG. 13 is a block diagram illustrating a configuration of an integrated circuit 2 according to another embodiment of the present disclosure. As shown in FIG. 13, the integrated circuit 2 may include an operation control circuit (OP CTR) 21, and a signal line sense amplifying circuit (SLSA) 23.

The operation control circuit 21 may include one or more processors and/or logic gates. The operation control circuit 21 may control the generation of a sharing signal SHAR, a pre-charge signal PCG, a sensing signal SEN, a latch signal LATS, and a calibration enable signals CEN<1:N>, based on a calibration operation signal CAL_OP and a sense amplifying operation signal SA_OP. The operation control circuit 21 may sequentially apply the pre-charge signal PCG, the sensing signal SEN, the latch signal LATS, and the calibration enable signals CEN<1:N> whose generation is controlled for a calibration operation to the signal line sense amplifying circuit 23 when the calibration operation signal CAL_OP is generated. The operation control circuit 21 may sequentially apply the pre-charge signal PCG, the sharing signal SHAR, the sensing signal SEN, and the latch signal LATS whose generation is controlled for a sense amplifying operation to the signal line sense amplifying circuit 23 when the calibration operation signal CAL_OP is generated.

The signal line sense amplifying circuit 23 may be connected to the operation control circuit 21 to receive the sharing signal SHARE, the pre-charge signal PCG, the sensing signal SEN, the latch signal LATS, and the calibration enable signals CEN<1:N>. The signal line sense amplifying circuit 23 may receive a reset signal RSTB, the pre-charge signal PCG, the sensing signal SEN, the latch signal LATS, and the calibration enable signals CEN<1:N> to perform a calibration operation. The signal line sense amplifying circuit 23 may be initialized by the reset signal RSTB in the calibration operation. The signal line sense amplifying circuit 23 may perform a pre-charge operation of setting the logic levels of the input data (DIN in FIG. 14) and the inverted input data (DINB in FIG. 14) to be the same as each other by the pre-charge signal PCG in the calibration operation. The signal line sense amplifying circuit 23 may sense and amplify the input data (DIN in FIG. 14) and the inverted input data (DINB in FIG. 14) by the sensing signal SEN in the calibration operation. The signal line sense amplifying circuit 23 may output the output data (DOUT in FIG. 14) and the inverted output data (DOUTB in FIG. 14) by the latch signal LATS through the second signal line (SL2 in FIG. 14) and the second inverted signal line (SL2B in FIG. 14) in the calibration operation.

The signal line sense amplifying circuit 23 may generate a first calibration signal CAL1<1:N> and a second calibration signal CAL2<1:N> by the output data (DOUT in FIG. 14) and the inverted output data (DOUTB in FIG. 14) by the calibration enable signals CEN<1:N> in the calibration operation. The signal line sense amplifying circuit 23 may calibrate the driving strength of the MOS transistors (213_1 and 213_2 in FIG. 14) by the first calibration signal CAL1<1:N> and the second calibration signal CAL2<1:N>. The signal line sense amplifying circuit 23 may include MOS transistors (225_1<1:N> in FIG. 14) that operate as calibration devices to calibrate the driving strength of the MOS transistor (213_1 in FIG. 14) for each bit included in the first calibration signal CAL1<1:N>. The signal line sense amplifying circuit 23 may include MOS transistors (225_3<1:N> in FIG. 14) that operate as calibration devices to calibrate the driving strength of the MOS transistor (213_2 in FIG. 14) for each bit included in the second calibration signal CAL2<1:N>. At least one of the MOS transistors (225_1<1:N> in FIG. 14) or at least one of the MOS transistors (225_3<1:N> in FIG. 14) may be turned on by the calibration operation.

The signal line sense amplifying circuit 23 may receive the pre-charge signal PCG, the sharing signal SHAR, the sensing signal SEN, and the latch signal LATS to perform a sense amplifying operation in the sensing amplifying operation performed after the calibration operation. The signal line sense amplifying circuit 23 may stop the pre-charge operation by the pre-charge signal PCG in the sense amplifying operation performed after the calibration operation. The signal line sense amplifying circuit 23 may enable the first signal line (SL1 in FIG. 14) and the first inverted signal line (SL1B in FIG. 14) to share signals with the input nodes (n211 and n212 in FIG. 14) by the sharing signal SHAR in the sense amplifying operation performed after the calibration operation. The signal line sense amplifying circuit 23 may output the output data (DOUT in FIG. 2) and the inverted output data (DOUTB in FIG. 2) by the latch signal LATS through the second signal line (SL2 in FIG. 14) and the second inverted signal line (SL2B in FIG. 14) in the sense amplifying operation performed after the calibration operation.

Figure 14:
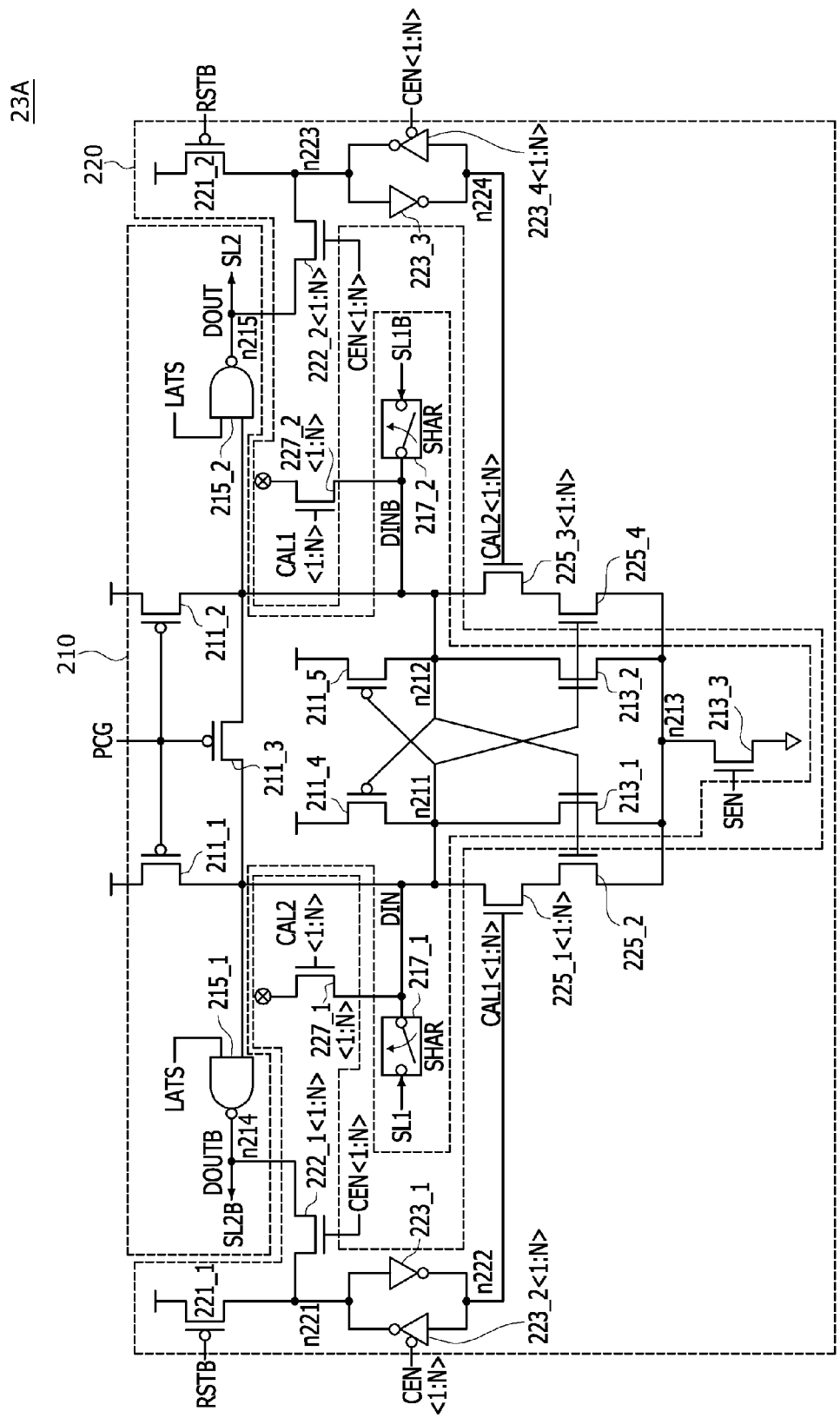
FIG. 14 is a circuit diagram of a signal line sense amplifying circuit according to another embodiment of the present disclosure.

FIG. 14 is a circuit diagram of a signal line sense amplifying circuit 23A according to another embodiment of the present disclosure. As shown in FIG. 14, the signal line sense amplifying circuit 23A may include a sense amplifying circuit 210 and a calibration circuit 220.

The sense amplifying circuit 210 may include PMOS transistors 211_1, 211_2, 211_3, 211_4, and 211_5; NMOS transistors 213_1, 213_2, and 213_3; NAND gates 215_1 and 215_2; and switching deices 217_1 and 217_2. The PMOS transistor 211_1 may be turned on when a pre-charge signal PCG is generated at a logic "low" level for a pre-charge operation to drive input data DIN to a logic "high" level. The PMOS transistor 211_2 may be turned on when the pre-charge signal PCG is generated at a logic "low" level for the pre-charge operation to drive inverted input data DINB to a logic "high" level. The PMOS transistor 211_3 may be turned on when the pre-charge signal PCG is generated at a logic "low" level for the pre-charge operation to set the voltage level of the input data DIN to be the same as the voltage level of the inverted input data DINB. The PMOS transistors 211_1, 211_2, and 211_3 may be turned off by the pre-charge signal PCG generated at a logic "high" level in a calibration operation and a sense amplifying operation. The PMOS transistor 211_4 may be turned on by the inverted input data DINB of a node n212 when a sensing signal SEN is generated at a logic "high" level to drive the input data DIN of a node n211 to a logic "high" level in the calibration operation and the sense amplifying operation. The nodes n211 and n212 may be set as input nodes. The PMOS transistor 211_5 may be turned on by the input data DIN of the node n211 when the sensing signal SEN is generated at a logic "high" level to drive the inverted input data DIN of the node n212 to a logic "high" level in the calibration operation and the sense amplifying operation. The NMOS transistor 213_1 may be connected between the node n211 and a node n213 and may be turned on by the inverted input data DINB of the node n212 when the sensing signal SEN is generated at a logic "high" level to drive the input data DIN of the node n211 to a logic "low" level in the calibration operation and the sense amplifying operation. The NMOS transistor 213_2 may be connected between the node n212 and the node n213 and may be turned on by the input data DIN of the node n211 when the sensing signal SEN is generated at a logic "high" level to drive the inverted input data DINB of the node n212 to a logic "low" level in the calibration operation and the sense amplifying operation. The NMOS transistor 213_3 may be turned on when the sensing signal SEN is generated at a logic "high" level to drive the node n213 to a logic "low" level in the calibration operation and the sense amplifying operation. The NAND gate 215_1 may receive the latch signal LATS and the input data DIN to perform a logical NAND operation. The NAND gate 215_1 may inversely buffer the input data DIN when the latch signal LATS is generated at a logic "high" level to output the inversely buffered signal of the input data DIN as the inverted output data DOUTB of a node n214 in the calibration operation and the sense amplifying operation. The inverted output data DOUTB may be output through the second inverted signal line SL2B. The NAND gate 215_2 may receive the latch signal LATS and the inverted input data DINB to perform a logical NAND operation. The NAND gate 215_2 may inversely buffer the inverted input data DINB to output the inversely buffered signal of the inverted input signal DINB as the output data DOUT of a node n215 in the calibration operation and the sense amplifying operation. The output data DOUT may be output through the second signal line SL2. The switching device 217_1 may be turned on when the sharing signal SHAR is generated at a logic "high" level to connect the first signal line SL1 and the node n211 so that the first signal line SL1 and the node n211 share the input data DIN of the node n211 with each other in the sense amplifying operation. The switching device 217_2 may be turned on when the sharing signal SHAR is generated at a logic "high" level to connect the first inverted signal line SL1B and the node n212 so that the first inverted signal line SL1B and the node n212 share the inverted input data DINB of the node n212 with each other in the sense amplifying operation. A voltage difference may occur between the input data DIN shared to the first signal line SL1 and the inverted input data DINB shared to the first inverted signal line SL1B.

The calibration circuit 220 may include PMOS transistors 221_1 and 221_2; NMOS transistors 222_1<1:N>, 222_2<1:N>, 225_1<1:N>, 225_2, 225_3<1:N>, 225_4, 227_1<1:N>, and 227_2<1:N>; and inverters 223_1, 223_2<1:N>, 223_3, and 223_4<1:N>. The PMOS transistor 221_1 may be turned on when a reset signal RST is generated at a logic "low" level for initialization to initialize the node n221 to a logic "high" level. The PMOS transistor 221_2 may be turned on when the reset signal RST is generated at a logic "low" level for initialization to initialize a node n223 to a logic "high" level. Each of the NMOS transistors 222_1<1:N> may be connected between a node n214 and a node n221, and may be turned on when each of the calibration enable signals CEN<1:N> is generated at a logic "high" level for the calibration operation to set the logic level of the node n221 according to the inverted output signal DOUTB of the node n214. Each of the NMOS transistors 222_2<1:N> may be connected between a node n215 and the node n223, and may be turned on when each of the calibration enable signals CEN<1:N> is generated at a logic "high" level for the calibration operation to set the logic level of the node n223 according to the output signal DOUT of the node n215. The inverter 223_1 may inversely buffer the signal of the node n221 to output the inversely buffered signal of the node n221 as the first calibration signal CAL1<1:N> of the node n222. Each of the inverters 223_2<1:N> may inversely buffer the first calibration signal CAL1<1:N> of the node n222 when each of the calibration enable signals CEN<1:N> is generated at a logic "low" level because the calibration operation is not performed to output the inversely buffered first calibration signal CAL1<1:N> of the node n222 to the node n221. The inverter 223_3 may inversely buffer the signal of the node n223 to output the inversely buffered signal of the node n223 as the second calibration signal CAL2<1:N> of the node n224. Each of the inverters 223_4<1:N> may inversely buffer the second calibration signal CAL2<1:N> of the node n224 when each of the calibration enable signals CEN<1:N> is generated at a logic "low" level because the calibration operation is not performed to output the inversely buffered second calibration signal CAL2<1:N> of the node n224 to the node n223. The logic levels of the first calibration signal CAL1<1:N> and the second calibration signal CAL2<1:N> may be determined by the driving strength of the NMOS transistor 213_1 and the driving strength of the NMOS transistor 213_2, respectively. The NMOS transistors 225<1:N> and 225_2 may be connected in series between the node n211 and the node n213. Each of the NMOS transistors 225<1:N> may be turned on when the first calibration signal CAL1<1:N> is generated at a logic "high" level because the driving strength of the NMOS transistor 213_1 is set to be weaker than the driving strength of the NMOS transistor 213_2 to operate as a calibration device that calibrates the driving strength of the NMOS transistor 213_1. The NMOS transistor 225_2 may be turned on when the inverted input signal DINB of the node n212 is at a logic "high" level. The NMOS transistors 225_3<1:N> and 225_4 may be connected in series between the node n212 and the node n213. Each of the NMOS transistors 225_3<1:N> may be turned on when the second calibration signal CAL2<1:N> is generated at a logic "high" level because the driving strength of the NMOS transistor 213_2 is set to be weaker than the driving strength of the NMOS transistor 213_1 to operate as a calibration device that calibrates the driving strength of the NMOS transistor 213_2. The NMOS transistor 225_4 may be turned on when the input signal DIN of the node n211 is at a logic "high" level. The NMOS transistor 227_1<1:N> may be connected between the node n211 and a floating node, and may be turned on by the second calibration signal CAL2<1:N>. The NMOS transistor 227_2<1:N> may be connected between the node n212 and the floating node, and may be turned on by the first calibration signal CAL1<1:N>. Each of the NMOS transistor 227_1<1:N> and the NMOS transistor 227_2<1:N> may operate as a compensating device that compensates for a capacitance difference between the input nodes n211 and n212 after the calibration operation is performed. The NMOS transistors 227_1<1:N> and 227_2<1:N> might not be used according to embodiments.

The signal line sense amplifying circuit 23A may perform a calibration operation of setting the logic level of each of the first calibration signal CAL1 and the second calibration signal CAL2 according to the driving strength of the NMOS transistor 213_1 and the driving strength of the NMOS transistor 213_2, respectively, and may perform a sense amplifying operation of sensing and amplifying the signals of the first signal line SL1 and the first inverted signal line SL1B and outputting the sensed and amplified signals of the first signal line SL1 and the first inverted signal line SL1B to the second signal line SL2 and the second inverted signal line SL2B in a state in which the driving strength of the NMOS transistor 213_1 and the driving strength of the NMOS transistor 213_2 are calibrated.

Figure 15:
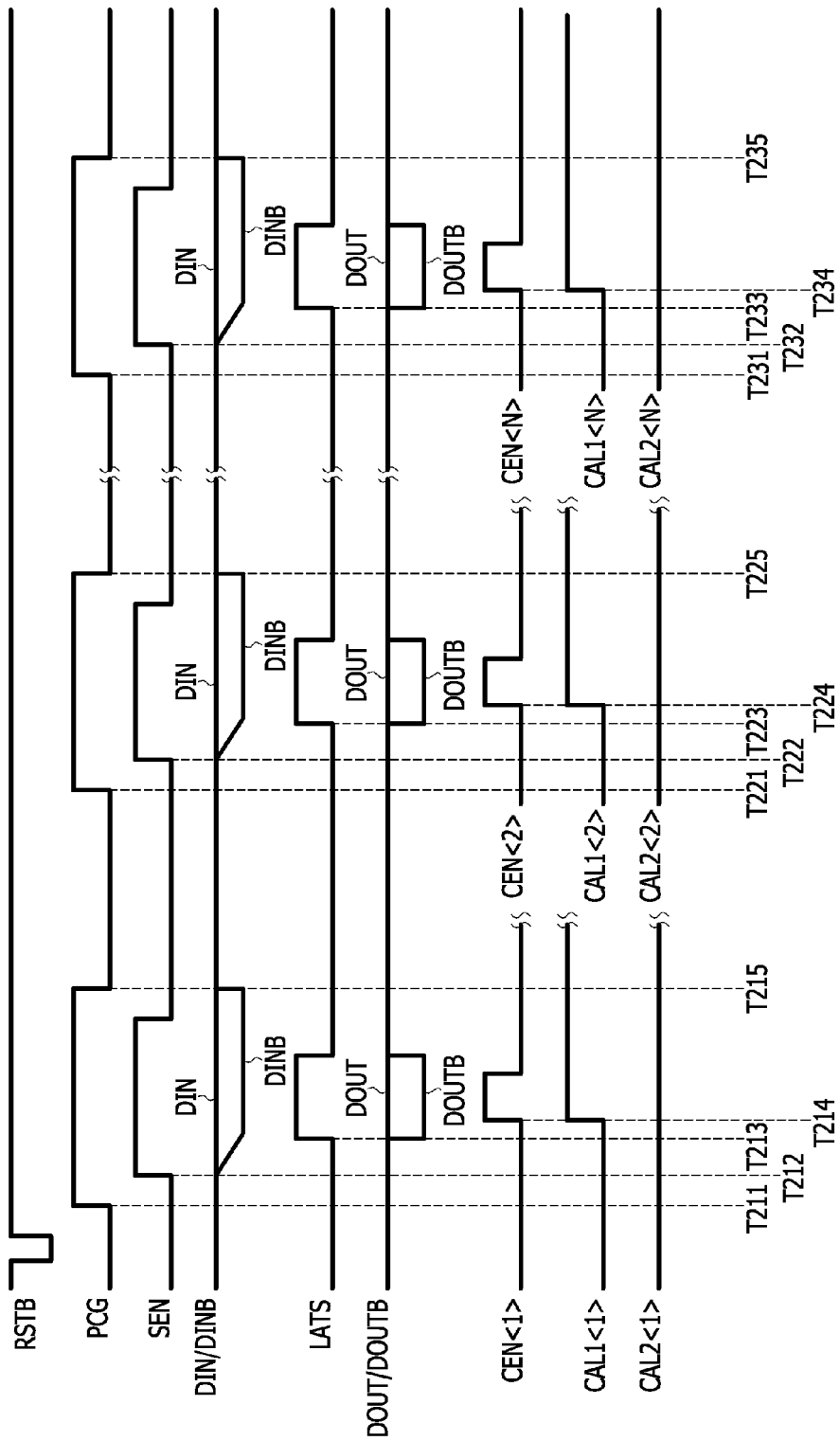
FIG. 15 is a timing diagram illustrating a calibration operation of a signal line sense amplifying circuit according to another embodiment of the present disclosure.

FIG. 15 is a timing diagram illustrating a calibration operation of the signal line sense amplifying circuit 23A according to another embodiment of the present disclosure. The calibration operation of the signal line sense amplifying circuit 23A will be described assuming that the driving strength of the NMOS transistor 213_1 is weaker than that of the NMOS transistor 213_2.

First, because the NMOS transistors 221_1 and 221_2 are turned on when a reset signal RSTB is generated at a logic "low" level ("L") for initialization in a section before a time point T211, the nodes n221 and n223 may all be initialized to a logic "high" level ("H"), and the first calibration signal CAL1<1:N> of the node n222 and the second calibration signal CAL2 of the node n224 <1:N>) may all be initialized to a logic "low" level ("L").

In addition, because the pre-charge signal PCG is generated at a logic "low" level ("L") for a pre-charge operation during a section before a time point T211, the PMOS transistors 211_1, 211_2, and 211_3 may all be turned on, so that the input data DIN of the node n211 and the inverted input data DINB of the node n212 may all be set to a logic "high" level.

Next, because the pre-charge signal PCG transitions from a logic "low" level ("L") to a logic "high" level ("H") at the time point T211, the PMOS transistors 211_1, 211_2, and 211_3 may all be turned off.

Next, because the sensing signal SEN is generated at a logic "high" level ("H") from a time point T212, the input data DIN of the node n211 and the inverted input data DINB of the node n212 may be sensed and amplified by the PMOS transistors 211_4 and 211_5 and the NMOS transistors 213_1 and 213_2. Because the driving strength of the NMOS transistor 213_1 is weaker than the driving strength of the NMOS transistor 213_2, the input data DIN of the node n211 may maintain a logic "high" level ("H") by the sense amplifying operation by the PMOS transistors 211_4 and 211_5 and the NMOS transistors 213_1 and 213_2, and the inverted input data DINB of the node n212 may transition from a logic "high" level ("H") to a logic "low" level ("L").

Next, because the latch signal LATS is generated at a logic "high" level ("H") from a time point T213, the inverted output data DOUTB may be generated at a logic "low" level ("L") by the input data DIN of a logic "high" level ("H"), and the output data DOUT may be generated at a logic "high" level ("H") by the inverted input data DINB of a logic "low" level "L".

Next, because the first bit CEN<1> of the calibration enable signal is generated at a logic "high" level ("H") from a time point T214, the first bit CAL1<1> of the first calibration signal may be generated at a logic "high" level ("H") by the inverted output data DOUTB of a logic "low" level ("L"), and the first bit CAL2<1> of the second calibration signal may be generated at a logic "low" level ("L") by the output data DOUT of a logic "high" level ("H"). When the NMOS transistor 225_1<1> is turned on by the first bit CAL<1> of the first calibration signal of a logic "high" level, the NMOS transistors 225_1<1> and 225_2 may drive the input data DIN of the node n211, together with the NMOS transistor 213_1. Accordingly, the driving strength of the NMOS transistor 213_1 may be calibrated by the NMOS transistors 225_1<1> and 225_2.

Next, at a time point T215, because the pre-charge signal PCG transitions from a logic "high" level ("H") to a logic "low" level ("L") and the PMOS transistors 211_1, 211_2, and 211_3 are all turned on, a pre-charge operation of setting the logic level of each of the input data DIN of the node n211 and the inverted input data DINB of the node 212 to a logic "high" level ("H").

Next, because the pre-charge signal PCG is generated at a logic "low" level ("L") for the pre-charge operation during a section before the time point T221, the PMOS transistors 211_1, 211_2, and 211_3 may all be turned on, and the input data DIN of the node n211 and the inverted input data DINB of the node n212 may all be set to a logic "high" level.

Next, because the pre-charge signal PCG transitions from a logic "low" level ("L") to a logic "high" level ("H") at the time point T221, all of the PMOS transistors 211_1, 211_2, and 211_3 may be turned off.

Next, because the sensing signal SEN is generated at a logic "high" level ("H") from a time point T222, the input data DIN of the node n211 and the inverted input data DINB of the node n212 may be sensed and amplified by the PMOS transistors 211_4 and 211_5 and the NMOS transistors 213_1 and 213_2. Because the driving strength of the NMOS transistor 213_1 is weaker than the driving strength of the NMOS transistor 213_2, the input data DIN of the node n211 may maintain a logic "high" level ("H") and the inverted input data DINB of the node n212 may transition from a logic "high" level ("H") to a logic "low" level ("L") by the sense amplifying operation by the PMOS transistors 211_4 and 211_5 and the NMOS transistors 213_1 and 213_2.

Next, because the latch signal LATS is generated at a logic "high" level ("H") from a time point T223, the inverted output data DOUTB may be generated at a logic "low" level ("L") by the input data DIN of a logic "high" level ("H"), and the output data DOUT may be generated at a logic "high" level ("H") by the inverted input data DINB of a logic "low" level ("L").

Next, because the second bit CEN<2> of the calibration enable signal is generated at a logic "high" level ("H") from a time point T224, the second bit CAL1<2> of the first calibration signal may be generated at a logic "high" level ("H") by the inverted output data DOUTB of a logic "low" level ("L"), and the second bit CAL2<2> of the second calibration signal may be generated at a logic "low" level ("L") by the output data DOUT of a logic "high" level ("H"). When the NMOS transistor 225_1<2> is turned on by the second bit CAL1<2> of the first calibration signal of a logic "high" level ("H"), the NMOS transistors 225_1<2> and 225_2 may drive the input data DIN of the node n211, together with the NMOS transistor 213_1. Accordingly, the driving strength of the NMOS transistor 213_1 may be calibrated by the NMOS transistors 225_1<2> and 225_2.

Next, at a time point T225, because the pre-charge signal PCG transitions from a logic high level ("H") to a logic "low" level ("L") and all of the PMOS transistors 211_1, 211_2, and 211_3 are turned on, a pre-charge operation in which both the input data DIN of the node n211 and the inverted input data DINB of the node n212 are set to a logic high level ("H") may be performed.

Next, because the pre-charge signal PCG is generated at a logic "low" level ("L") for a pre-charge operation during a section before a time point T231, the PMOS transistors 211_1, 211_2, and 211_3 may all be turned on, so that the input data DIN of the node n211 and the inverted input data DINB of the node n212 may all be set to a logic "high" level.

Next, because the pre-charge signal PCG transitions from a logic "low" level ("L") to a logic "high" level ("H") at the time point T231, the PMOS transistors 211_1, 211_2, and 211_3 may all be turned off.

Next, because the sensing signal SEN is generated at a logic "high" level ("H") from a time point T232, the input data DIN of the node n211 and the inverted input data DINB of the node n212 may be sensed and amplified by the PMOS transistors 211_4 and 211_5 and the NMOS transistors 213_1 and 213_2. Because the driving strength of the NMOS transistor 213_1 is weaker than the driving strength of the NMOS transistor 213_2, the input data DIN of the node n211 may maintain a logic "high" level ("H"), and the inverted input data DINB of the node n212 may transition from a logic "high" level ("H") to a logic "low" level ("L") by the sense amplifying operation by the PMOS transistors 211_4 and 211_5 and the NMOS transistors 213_1 and 213_2.

Next, because the latch signal LATCH is generated at a logic "high" level from a time point T233, the inverted output data DOUTB may be generated at a logic "low" level ("L") by the input data DIN of a logic "high" level ("H"), and the output data DOUT may be generated at a logic "high" level ("H") by the inverted input data DINB of a logic "low" level ("L").

Next, because the Nth bit CEN<N> of the calibration enable signal is generated at a logic "high" level ("H") from a time point T234, the $N^{th}$ bit CAL1<N> of the first calibration signal may be generated at a logic "high" level ("H") by the inverted output data DOUTB of a logic "low" level ("L"), and the Nth bit CAL2<N> of the second calibration signal may be generated at a logic "low" level ("L") by the output data DOUT of a logic "high" level ("H"). When the NMOS transistor 225_1<N> is turned on by the Nth bit CAL1<N> of the first calibration signal of a logic "high" level ("H"), the NMOS transistors 225_1<N> and 225_2 may drive the input data DIN of the node n211, together with the NMOS transistor 213_1. Accordingly, the driving strength of the NMOS transistor 213_1 may be calibrated by the NMOS transistors 225_1<N> and 225_2.

Finally, at a time point T235, because the pre-charge signal PCG transitions from a logic "high" level ("H") to a logic "low" level ("L") and all of the PMOS transistors 211_1, 211_2, and 211_3 are turned on, a pre-charge operation in which all of the input data DIN of the node n211 and the inverted input data DINB of the node n212 are set to a logic "high" level ("H") may be performed.

As described above, the signal line sense amplifying circuit 23A may include the NMOS transistors 225_1<1:N> and 225_3<1> that operate as calibration devices capable of calibrating the driving strength of the NMOS transistors 213_1 and 213_2<1:N>, and may perform a calibration operation of determining whether to turn on each of the NMOS transistors 225_1<1:N> and 225_3<1:N> for each bit included in the calibration enable signal CEN<1:N>. When at least one of the NMOS transistors 225_1<1:N> and 225_3<1:N> is turned on, the driving strength of the NMOS transistors 213_1 and 213_2 may be calibrated.

In the present embodiment, the sensing signal SEN and the latch signal LATS are implemented as separate signals, but the sensing signal SEN and the latch signal LATS may be implemented as the same signal in other embodiments. The NAND gates 215_1 and 215_2 included in the sense amplifying circuit 210 may be implemented to operate by receiving the sensing signal SEN instead of the latch signal LATS.

Figure 16:
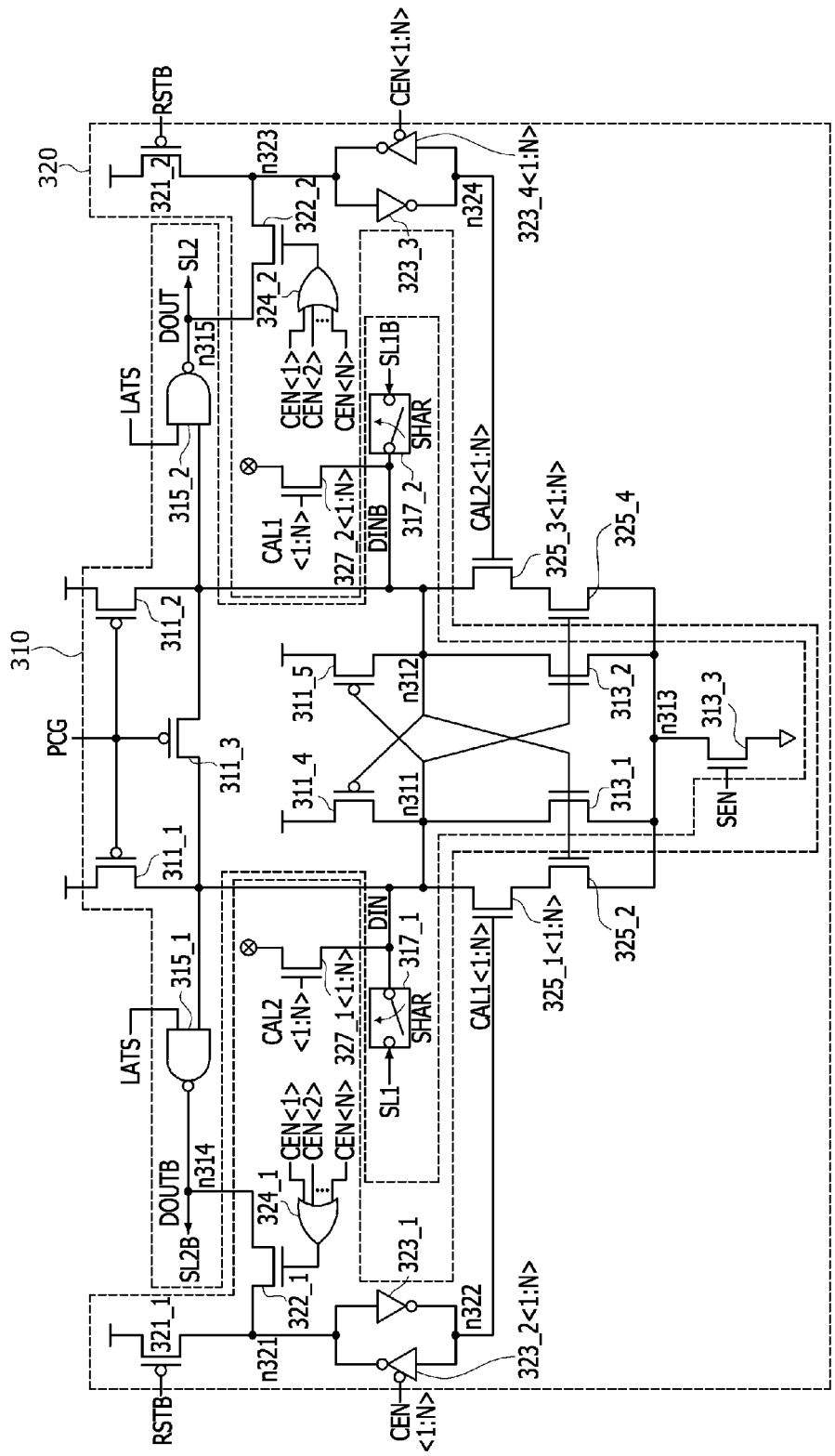
FIG. 16 is a circuit diagram of a signal line sense amplifying circuit according to yet another embodiment of the present disclosure.

FIG. 16 is a circuit diagram of a signal line sense amplifying circuit 23B according to yet another embodiment of the present disclosure. As shown in FIG. 16, the signal line sense amplifying circuit 23B may include a sense amplifying circuit 310 and a calibration circuit 320.

The sense amplifying circuit 310 may include PMOS transistors 311_1, 311_2, 311_3, 311_4, and 311_5; NMOS transistors 313_1, 313_2, and 313_3; NAND gates 315_1 and 315_2; and switching devices 317_1 and 317_2. The PMOS transistor 311_1 may be turned on when a pre-charge signal PCG is generated at a logic "low" level for a pre-charge operation to drive input data DIN to a logic "high" level. The PMOS transistor 311_2 may be turned on when the pre-charge signal PCG is generated at a logic "low" level for a pre-charge operation to drive inverted input data DINB to a logic "high" level. The PMOS transistor 311_3 may be turned on when the pre-charge signal PCG is generated at a logic "low" level for a pre-charge operation to set the voltage level of the input data DIN to be the same as the voltage level of the inverted input data DINB. The PMOS transistors 311_1, 311_2, and 311_3 may be turned off by the pre-charge signal PCG generated at a logic "high" level in a calibration operation and a sense amplifying operation. The PMOS transistor 311_4 may be turned on by the inverted input data DINB when a sensing signal SEN is generated at a logic "high" level in the calibration operation and the sense amplifying operation to drive the input data DIN of the node n311 to a logic "high" level. The nodes n311 and n312 may be set as input nodes. The PMOS transistor 311_5 may be turned on by the input data DIN of the node n311 when the sensing signal SEN is generated at a logic "high" level in the calibration operation and the sense amplifying operation to drive the inverted input data DINB of the node n312 to a logic "high" level. The NMOS transistor 313_1 may be connected between the node n311 and a node n313 and may be turned on by the inverted input data DINB of the node n312 when the sensing signal SEN is generated at a logic "high" level to drive the input data DIN of the node n311 to a logic "low" level in the calibration operation and the sense amplifying operation. The NMOS transistor 313_2 may be connected between the node n312 and the node n313 and may be turned on by the input data DIN of the node n311 when the sensing signal SEN is generated at a logic "high" level to drive the inverted input data DINB of the node n312 to a logic "low" level in the calibration operation and the sense amplifying operation. The NMOS transistor 313_3 may be turned on when the sensing signal SEN is generated at a logic "high" level to drive the node n313 to a logic "low" level in the calibration operation and the sense amplifying operation. The NAND gate 315_1 may receive the latch signal LATS and the input data DIN to perform a logical NAND operation. The NAND gate 315_1 may inversely buffer the input data DIN to output the inversely buffered signal of the input data DIN as the inverted output data DOUTB of the node n314 in the calibration operation and the sense amplifying operation. The inverted output data DOUTB may be output through the second inverted signal line SL2B. The NAND gate 315_2 may receive the latch signal LATS and the inverted input data DINB to perform a logical NAND operation. The NAND gate 315_2 may inversely buffer the inverted input data DINB to output the inversely buffered signal of the inverted input data DINB as the output data DOUT of the node n315 when the latch signal LATS is generated at a logic "high" level in the calibration operation and the sense amplifying operation. The output data DOUT may be output through the second signal line SL2. The switching device 317_1 may be turned on when the sharing signal SHAR is generated at a logic "high" level to connect the first signal line SL1 and the node n311 to each other so that the first signal line SL1 and the node n311 share the input data DIN of the node n311 with each other. The switching device 317_2 may be turned on when the sharing signal SHAR is generated at a logic "high" level to connect the first inverted signal line SL1B and the node n312 so that the first inverted signal line SL1B and the node n312 share the inverted input data DINB of the node n312 with each other. There may be generated a voltage difference between the input data DIN shared by the first signal line SL1 and the inverted input data DINB shared by the first inverted signal line SL1B.

The calibration circuit 320 may include PMOS transistors 321_1 and 321_2; OR gates 324_1 and 324_2; NMOS transistors 322_1, 322_2, 325_1<1:N>, 325_2, 325_3<1:N>, 325_4, 327_1<1:N>, and 327_2<1:N>; and inverters 323_1, 323_2<1:N>, 323_3, and 323_4<1:N>. The PMOS transistor 321_1 may be turned on when a reset signal RSTB is generated at a logic "low" level for initialization to initialize a node n321. The PMOS transistor 321_2 may be turned on when the reset signal RSTB is generated at a logic "low" level for initialization to initialize a node n323. Each of the OR gates 324_1 and 324_2 may receive the calibration enable signals CEN<1:N> to perform a logical OR operation. Each of the OR gates 324_1 and 324_2 may output a signal of a logic "high" level when one bit of the calibration enable signals CEN<1:N> is at a logic "high" level. The NMOS transistor 322_1 may be connected between the node n314 and the node n321, and may be turned on when the output of the OR gate 324_1 is generated at a logic "high" level for a calibration operation to set the logic level of the node n321 according to the inverted output signal DOUTB of the node n314. The NMOS transistor 322_2 may be connected between the node n315 and the node n323, and may be turned on when the output of the OR gate 324_2 is generated at a logic "high" level for the calibration operation to set the logic level of the node n323 according to the output signal DOUT of the node n315. The inverter 323_1 may inversely buffer the signal of the node n321 to output the inversely buffered signal of the node n321 as a first calibration signal CAL1<1:N> of the node n322. Each of the inverters 323_2<1:N> may inversely buffer the first calibration signal CAL1<1:N> of the node n322 to output the inversely buffered signal of the first calibration signal CAL1<1:N> to the node n321 when each of the calibration enable signals CEN<1:N> is generated at a logic "low" level because the calibration operation is not performed. The inverter 323_3 may inversely buffer the signal of the node n323 to output the inversely buffered signal of the node n323 as a second calibration signal CAL2<1:N> of the node n324. Each of the inverters 323_4<1:N> to the node n323 when the calibration operation is not performed and each of the calibration enable signals CEN<1:N> is generated at a logic "low" level. The logic levels of the first calibration signal CAL1<1:N> and the second calibration signal CAL2<1:N> may be determined by the driving strength of the NMOS transistor 313_1 and the driving strength of the NMOS transistor 313_2, respectively. The NMOS transistors 325_1<1:N> and 325_2 may be connected in series between the node n311 and the node n313. Each of the NMOS transistors 325_1<1:N> may be turned on when the driving strength of the NMOS transistor 313_1 is set to be weaker than the driving strength of the NMOS transistor 313_2 so that the first calibration signal CAL1<1:N> is generated at a logic "high" level, to operate as a calibration device that calibrates the driving strength of the NMOS transistor 313_1. The NMOS transistor 325_2 may be turned on when the inverted input signal SINB of the node n312 is at a logic "high" level. The NMOS transistors 325_3<1:N> and 325_4 may be connected in series between the node n312 and the node 313. Each of the NMOS transistors 325_3<1:N> may be turned on when the driving strength of the NMOS transistor 313_2 is set to be weaker than that of the NMOS transistor 313_1 so that the second calibration signal CAL2<1:N> is generated at a logic "high" level, to operate as a calibration device that calibrates the driving strength of the NMOS transistor 313_2. The NMOS transistor 325_4 may be turned on when the input signal DIN of the node n311 is at a logic "high" level. The NMOS transistor 327_1<1:N> may be connected between the node n311 and a floating node and may be turned on by the second calibration signal CAL2<1:N>. The NMOS transistor 327_2<1:N> may be connected between the node n312 and the floating node and may be turned on by the first calibration signal CAL1<1:N>. Each of the NMOS transistor 327_1<1:N> and the NMOS transistor 327_2<1:N> may operate as a compensating device that compensates for the capacitance difference between the input nodes n311 and n312 after the calibration operation is performed. The NMOS transistors 327_1<1:N> and 327_2<1:N> might not be used according to embodiments.

The signal line sense amplifying circuit 23B may include NMOS transistors 325_1<1:N> and 325_3<1:N> that operate as calibration devices capable of calibrating the driving strength of the NMOS transistors 313_1 and 313_2, and may perform a calibration operation of determining whether to turn on each of the NMOS transistors 325_1<1:N> and 325_3<1:N> for each bit included in the calibration enable signals CEN<1:N>. When at least one of the NMOS transistors 325_1<1:N> and 325_3<1:N> is turned on, the driving strength of the NMOS transistors 313_1 and 313_2 may be calibrated.

In the present embodiments, the sensing signal SEN and the latch signal LATS are implemented as separate signals, but the sensing signal SEN and the latch signal LATS may be implemented as the same signal in other embodiments. The NAND gates 315_1 and 315_2 included in the sense amplifying circuit 310 may be implemented to operate by receiving the sensing signal SEN instead of the latch signal LATS.

Concepts have been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An integrated circuit comprising:
   an operation control circuit configured to control generation of a sharing signal, a pre-charge signal, a sensing signal, a latch signal, and a calibration enable signal for a calibration operation and a sense amplifying operation; and
   a signal line sense amplifying circuit configured to receive the sharing signal, the pre-charge signal, the sensing signal, the latch signal, and the calibration enable signal to perform the calibration operation and the sense amplifying operation,
   wherein the signal line sense amplifying circuit includes metal-oxide semiconductor field-effect (MOS) transistors for driving input nodes to which input data and inverted input data are input, is configured to calibrate a driving strength of each of the MOS transistors in the calibration operation, and is configured to generate output data by sensing and amplifying the input data and the inverted input data in the sense amplifying operation performed in a state in which the calibration operation is performed.

2. The integrated circuit of claim 1, wherein the operation control circuit is configured to sequentially apply the pre-charge signal, the sensing signal, the latch signal, and the calibration enable signal, whose generations are controlled based on a calibration operation signal in the calibration operation, to the signal line sense amplifying circuit.

3. The integrated circuit of claim 1, wherein the signal line sense amplifying circuit is configured to be initialized by a reset signal in the calibration operation.

4. The integrated circuit of claim 1, wherein the signal line sense amplifying circuit is configured to set the logic levels of the input data and the inverted input data to be the same by the pre-charge signal in the calibration operation.

5. The integrated circuit of claim 1, wherein the signal line sense amplifying circuit is configured to sense and amplify the input data and the inverted input data by the sensing signal in the calibration operation.

6. The integrated circuit of claim 1, wherein the signal line sense amplifying circuit is configured to generate output data and inverted output data from the input data and the inverted input data by the latch signal in the calibration operation.

7. The integrated circuit of claim 1, wherein the signal line sense amplifying circuit is configured to generate a first calibration signal and a second calibration signal from the output data and the inverted output data by the calibration enable signal in the calibration operation.

8. The integrated circuit of claim 7,
   wherein the MOS transistors include a first MOS transistor and a second MOS transistor, and wherein the signal line sense amplifying circuit further includes:
  a first calibration device connected in parallel to the first MOS transistor and turned on based on the first calibration signal; and
  a second calibration device connected in parallel to the second MOS transistor and turned on based on the second calibration signal.

9. The integrated circuit of claim 8,
wherein the input nodes include a first input node and a second input node,
wherein the signal line sense amplifying circuit further includes:
  a first compensating device connected between the first input node in which the input data is generated and a floating node, and turned on based on the second calibration signal; and
  a second compensating device connected between the second input node in which the inverted input data is generated and the floating node, and turned on based on the first calibration signal, and
wherein the first compensating device and the second compensating device compensate for a capacitance difference between the first input node and the second input node.

10. The integrated circuit of claim 1, wherein the operation control circuit is configured to sequentially apply the pre-charge signal, the sharing signal, the sensing signal, and the latch signal to the signal line sense amplifying circuit, generation of each of the pre-charge signal, the sharing signal, the sensing signal, and the latch signal being controlled based on a sense amplifying operation signal in the sense amplifying operation.

11. The integrated circuit of claim 1, wherein the signal line sense amplifying circuit is configured to enable a first signal line and a second inverted signal line to share signals with the input nodes by the sharing signal to generate a voltage difference between the input nodes in the sense and amplifying operation.

12. The integrated circuit of claim 1, wherein the signal line sense amplifying circuit is configured to:
  sense and amplify the input data and the inverted input data by the sensing signal in the sense amplifying operation,
  generate output data and inverted output data from the input data and the inverted input data by the latch signal in the sense amplifying operation, and
  output the output data and the inverted output data to a second signal line and a second inverted signal line.

13. The integrated circuit of claim 1,
wherein the signal line sense amplifying circuit includes a sense amplifying circuit, and
wherein the sense amplifying circuit is configured to:
  set the logic levels of the input data and the inverted input data to be the same as each other by the pre-charge signal in the calibration operation,
  sense and amplify the input data and the inverted input data by the sensing signal in the calibration operation, and
  generate the output data and the inverted output data from the input data and the inverted input data by the latch signal in the calibration operation.

14. The integrated circuit of claim 13, wherein the signal line sense amplifying circuit is configured to:
enable the first signal line and the first inverted signal line to share signals with the input nodes by the sharing signal to generate a voltage difference between the input nodes in the sense and amplifying operation,
sense and amplify the input data and the inverted input data by the sensing signal in the sense and amplifying operation,
generate the output data and the inverted output data from the input data and the inverted input data by the latch signal in the sense and amplifying operation, and
output the output data and the inverted output data to the second signal line and the second inverted signal line.

15. The integrated circuit of claim 1,
wherein the signal line sense amplifying circuit includes a calibration circuit, and
wherein the calibration circuit is configured to generate a first calibration signal and a second calibration signal from the output data and the inverted output data by the calibration enable signal in the calibration operation.

16. The integrated circuit of claim 15,
wherein the MOS transistors include a first MOS transistor and a second MOS transistor, and
wherein the calibration circuit includes:
  a first calibration device connected in parallel to the first MOS transistor and turned on based on the first calibration signal; and
  a second calibration device connected in parallel to the second MOS transistor and turned on based on the second calibration signal.

17. A signal line sense amplifying circuit comprising:
a sense amplifying circuit including metal-oxide semiconductor field-effect (MOS) transistors for driving input nodes to which input data and inverted input data are input in a calibration operation and a sense amplifying operation; and
a calibration circuit configured to generate calibration signals for calibrating a driving strength of each of the MOS transistors in the calibration operation,
wherein the sense amplifying circuit is configured to sense and amplify the input data and the inverted input data to generate output data and inverted output data in the sense amplifying operation performed in a state in which the calibration operation is performed based on the calibration signals.

18. The signal line sense amplifying circuit of claim 17,
wherein the MOS transistors include a first MOS transistor and a second MOS transistor,
wherein the calibration signals include a first calibration signal and a second calibration signal, and
wherein the calibration circuit includes:
  a first calibration device connected in parallel to the first MOS transistor and turned on based on the first calibration signal; and
  a second calibration device connected in parallel to the second MOS transistor and turned on based on the second calibration signal.

19. The signal line sense amplifying circuit of claim 18,
wherein the input nodes include a first input node and a second input node,
wherein the sense amplifying circuit includes:
  a first compensating device connected between the first input node in which the input data is generated and a floating node, and turned on based on the second calibration signal; and
  a second compensating device connected between the second input node in which the inverted input data is generated and the floating node, and turned on based on the first calibration signal, and wherein the first compensating device and the second compensating device compensate for a capacitance difference between the first input node and the second input node.

20. The signal line sense amplifying circuit of claim 17, wherein the sense amplifying circuit is configured to:
set logic levels of the input data and the inverted input data to be the same as each other by a pre-charge signal in the calibration operation,
sense and amplify the input data and the inverted input data by a sensing signal in the calibration operation, and
generate the output data and the inverted output data from the input data and the inverted input data by a latch signal in the calibration operation.

21. The signal line sense amplifying circuit of claim 17, wherein the sense amplifying circuit is configured to:
enable the first signal line and the first inverted signal line to share signals with the input nodes by a sharing signal to generate a voltage difference between the input nodes in the sense amplifying operation,
sense and amplify the input data and the inverted input data by the sensing signal in the sense amplifying operation,
generate the output data and the inverted output data from the input data and the inverted input data by the latch signal in the sense amplifying operation, and
output the output data and the inverted output data to a second signal line and a second inverted signal line.

22. A signal line sense amplifying circuit comprising:
a sense amplifying circuit including metal-oxide semiconductor field-effect (MOS) transistors for driving input nodes to which input data and inverted input data are input in a calibration operation and a sense amplifying operation;
a first calibration circuit configured to generate first calibration signals for calibrating a driving strength of each of the MOS transistors in the calibration operation; and
a second calibration circuit configured to generate second calibration signals for calibrating a driving strength of each of the MOS transistors in the calibration operation,
wherein the sense amplifying circuit is configured to sense and amplify the input data and the inverted input data to generate output data and inverted output data in the sense amplifying operation performed in a state in which the calibration operation is performed based on the first calibration signals and the second calibration signals.

* * * * *